United States Patent
Wortman et al.

(10) Patent No.: US 9,240,804 B2
(45) Date of Patent: Jan. 19, 2016

(54) TECHNIQUES FOR ALIGNMENT OF PARALLEL SIGNALS

(71) Applicant: Altera Corporation, San Jose, CA (US)

(72) Inventors: Curt Wortman, San Jose, CA (US); David Mendel, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/759,869

(22) Filed: Feb. 5, 2013

(65) Prior Publication Data

US 2014/0218221 A1 Aug. 7, 2014

(51) Int. Cl.
  *H04L 7/00* (2006.01)
  *H03M 9/00* (2006.01)
  *H04L 25/14* (2006.01)
  *H04J 3/04* (2006.01)
  *H04J 3/06* (2006.01)

(52) U.S. Cl.
  CPC .............. *H03M 9/00* (2013.01); *H04L 7/0012* (2013.01); *H04L 25/14* (2013.01); *H04J 3/047* (2013.01); *H04J 3/0608* (2013.01)

(58) Field of Classification Search
  CPC ..... H04L 7/0896; H04L 7/087; H04L 7/0891; H04L 7/0008; H04L 7/02; H04L 7/0337; H04L 7/0334; H04L 7/0083; H04L 7/033; H04L 7/027; H04L 7/04; H04L 1/026; G06F 1/10; H04J 3/0685; H04J 3/0688; H04J 3/0682; H04J 3/076
  USPC .......................... 375/354–359, 362, 371–376
  See application file for complete search history.

(56) References Cited

U.S. PATENT DOCUMENTS

| | | | | |
|---|---|---|---|---|
| 5,648,953 | A * | 7/1997 | Kim ........................ | 369/124.07 |
| 6,288,656 | B1 * | 9/2001 | Desai ........................ | 341/100 |
| 6,970,435 | B1 * | 11/2005 | Buchanan et al. ............ | 370/278 |
| 7,301,996 | B1 * | 11/2007 | Chi et al. ..................... | 375/226 |
| 7,982,639 | B1 | 7/2011 | Wortman | |
| 2004/0222826 | A1 * | 11/2004 | Takeuchi et al. .............. | 327/123 |
| 2005/0010701 | A1 * | 1/2005 | Elboim .......................... | 710/52 |
| 2005/0069071 | A1 * | 3/2005 | Kim et al. ..................... | 375/355 |
| 2008/0063127 | A1 * | 3/2008 | Hayashi et al. ............... | 375/362 |
| 2009/0161738 | A1 * | 6/2009 | Carvalho et al. ............. | 375/219 |

OTHER PUBLICATIONS

"Transceiver Architecture in Stratix V Devices," Altera Corporation, Stratix V Device Handbook vol. 2: Transceivers, Jun. 2012, pp. 1-46.
"Transceiver Architecture in Stratix IV Devices," Altera Corporation, Stratix IV Device Handbook vol. 2: Transceivers, Dec. 2011, pp. 1-228.

* cited by examiner

*Primary Examiner* — Dac Ha
*Assistant Examiner* — Janice Tieu
(74) *Attorney, Agent, or Firm* — Steven J. Cahill

(57) ABSTRACT

Receiver circuits in serial lanes each generate a synchronous clock signal that is aligned with a master clock signal to allow synchronous transfer of data onto the master clock domain without corruption. A serial-to-parallel converter circuit in each receiver circuit converts a serial data signal into parallel data signals in response to one of the synchronous clock signals. Phase detection circuitry generates an indication of a phase shift based on a phase offset between the synchronous and master clock signals. A clock signal generation circuit provides an adjustment to a phase of the synchronous clock signal based on the indication of the phase shift. The serial-to-parallel converter circuit adjusts positions of bits indicated by the parallel data signals based on the adjustment to the phase of the synchronous clock signal.

27 Claims, 18 Drawing Sheets

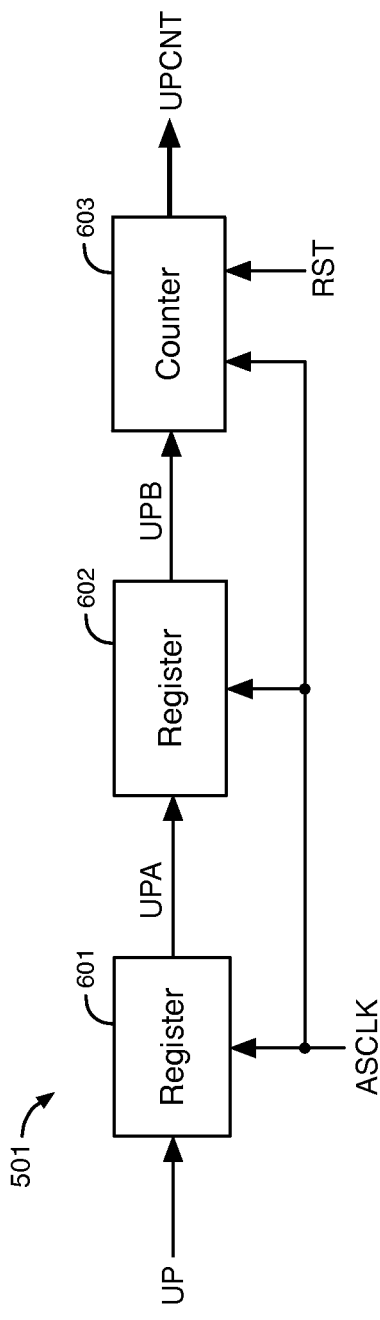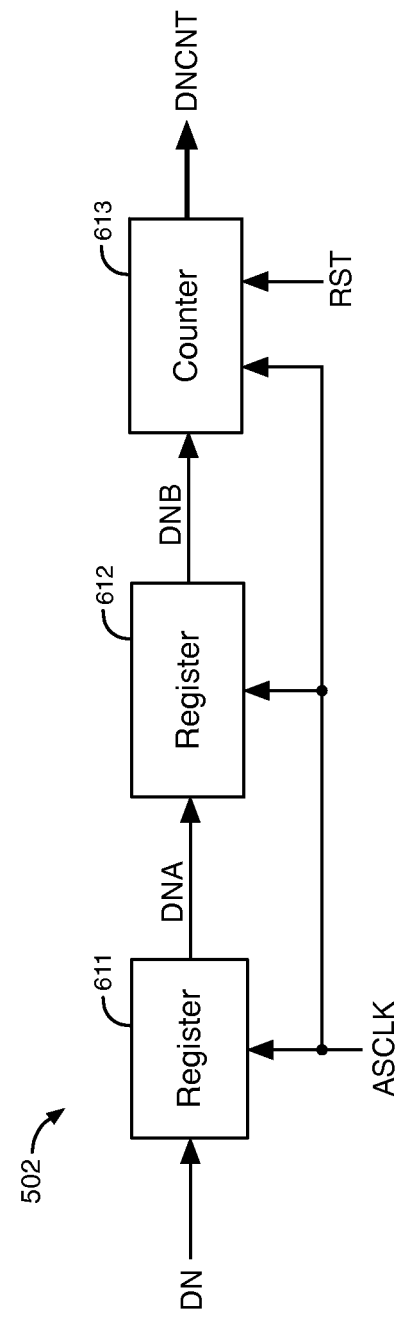
FIG. 6A
FIG. 6B

TECHNIQUES FOR ALIGNMENT OF PARALLEL SIGNALS

FIELD OF THE DISCLOSURE

The present disclosure relates to electronic circuits, and more particularly, to techniques for alignment of parallel signals.

BACKGROUND

Data is often transmitted in serial at a high data rate between integrated circuits. When more bandwidth is required than the desired serial data rate, data is spread across multiple serial data streams through distribution, carried across a given medium, and aggregated at the receiving end. Each serial data stream transmitted across the medium may experience a different propagation delay, causing each serial data stream to lose its associated alignment with the other serial data streams forming the link.

An integrated circuit receives a serial data signal from another integrated circuit. The receiving integrated circuit can convert the serial data in the serial data signal into parallel data to allow for operation of digital logic at lower speeds. For example, the receiving integrated circuit may convert the incoming serial data signal into successive bytes or words of parallel data. The parallel data has a lower data rate than the serial data. The parallel data is stored in the receiving integrated circuit at a lower clock frequency than the clock frequency used to sample the serial data.

BRIEF SUMMARY

According to some embodiments, a plurality of serial-to-parallel converter circuits convert multiple serial data signals into multiple parallel data signals each with its own synchronous clock signal. A plurality of phase detector circuits are used to generate an indication of a phase offset between a master clock signal and each of the synchronous clock signals. For each serial lane, a control circuit generates an indication of a phase shift based on the indication of the phase offset between the master clock signal and the synchronous clock signal in that lane. A clock signal generation circuit provides an adjustment to a phase of the synchronous clock signal based on the indication of the phase shift. The serial-to-parallel converter circuit adjusts when the accumulated serial bits are transferred to the domain of the master clock signal by the adjustment to the phase of the synchronous clock signal. A storage circuit stores values of the parallel data signals in response to the master clock signal.

According to other embodiments, the serial-to-parallel converter circuits, the phase detector circuits, and the control circuits cause each of the synchronous clock signals generated by the receiver circuits in the serial lanes to be more closely aligned with the master clock signal to allow synchronous transfer of data onto the master clock domain without corruption. The offset between each of the synchronous clock signals and the master clock signal is determined by the setup and hold time of storage circuits in a word alignment circuit in the respective serial lane. As a result, each serial lane stores accurate values of the bits in the parallel data signals in response to the master clock signal. The synchronous clock signals generated by receiver circuits in the serial lanes are aligned with each other within a bit period. Also, the bits in the serial data signals are converted into parallel with reduced latency, and the parallel data signals generated by the receiver circuits are word aligned. As a result, the parallel data signals generated by the receiver circuits are de-skewed with respect to each other.

According to further embodiments, a serial-to-parallel converter circuit converts a serial data signal into first parallel data signals. A barrel shifter circuit generates second parallel data signals based on the first parallel data signals. The barrel shifter circuit comprises multiplexer circuits that shift the alignment of bits indicated by the second parallel data signals relative to a predefined pattern used to represent the word boundary. Each of the multiplexer circuits may adjust by multiple bits versus by single bit granularity or eliminated. Manipulation of the serial-to-parallel data transfer can be used in combination to a parallel domain barrel shifter.

Various objects, features, and advantages of the present invention will become apparent upon consideration of the following detailed description and the accompanying drawings.

BRIEF DESCRIPTION OF THE DRAWINGS

FIG. 6A illustrates an example of the UP sampler circuit of FIG. 5, according to an embodiment of the present invention.

FIG. 6B illustrates an example of the DN sampler circuit of FIG. 5, according to an embodiment of the present invention.

DETAILED DESCRIPTION

Figure 1:
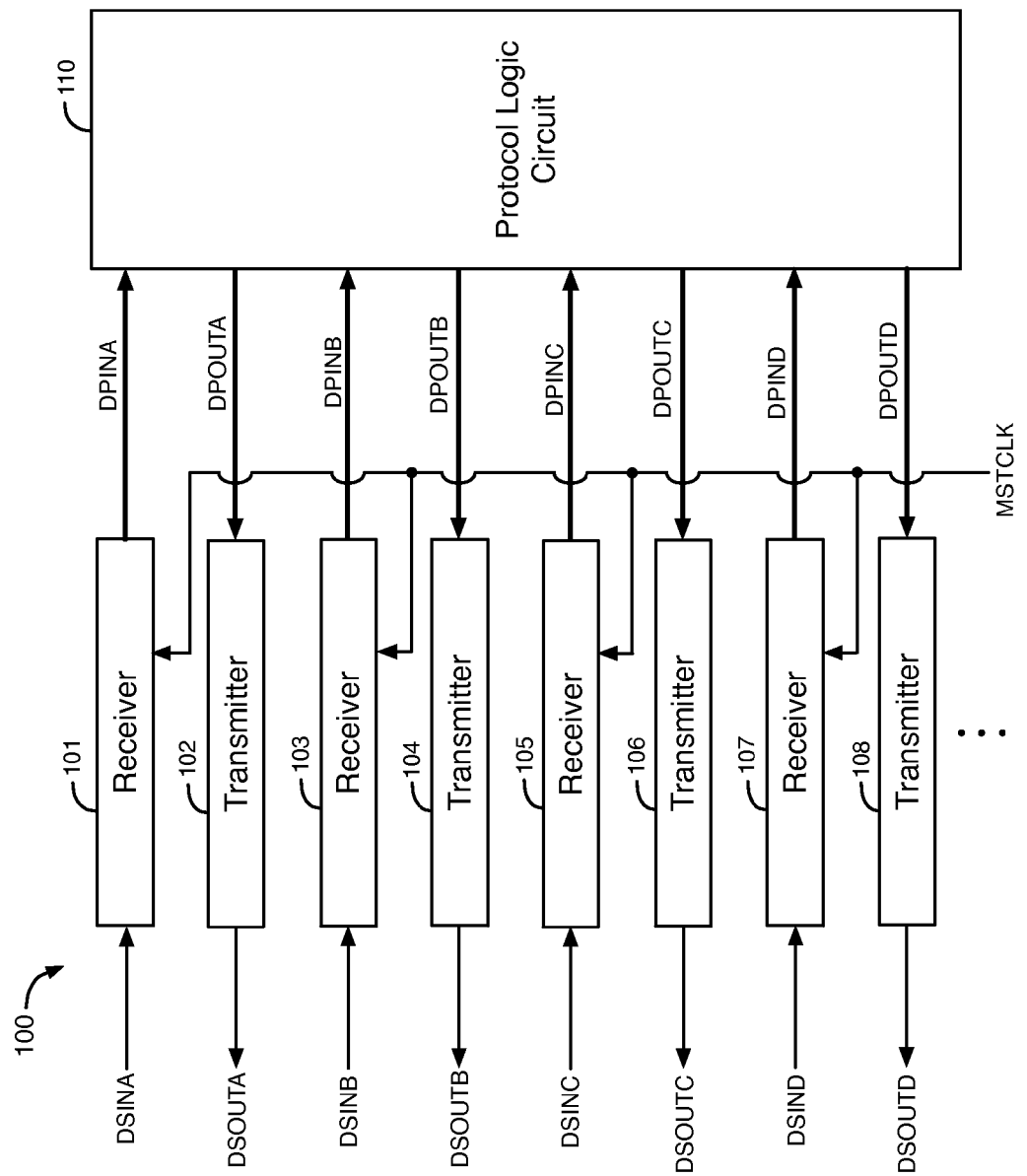
FIG. 1 illustrates an example of a multi-lane high-speed serial interface (HSSI) circuit that converts data between serial and parallel, according to an embodiment of the present invention.

FIG. 1 illustrates an example of a high-speed serial interface (HSSI) circuit 100 containing multiple lanes that converts data between serial and parallel, according to an embodiment of the present invention. HSSI circuit 100 includes receiver circuits 101, 103, 105, and 107. HSSI circuit 100 also includes transmitter circuits 102, 104, 106, and 108. FIG. 1 also illustrates a protocol logic circuit 110. HSSI 100 and protocol logic circuit 110 are in an integrated circuit. As an example that is not intended to be limiting, the integrated circuit may be a field programmable gate array, and protocol logic circuit 110 may include programmable logic circuits.

Receiver circuits 101, 103, 105, and 107 receive 4 serial data signals DSINA, DSINB, DSINC, and DSIND, respectively, from a source that is external to the integrated circuit containing HSSI 100. A master periodic clock signal MSTCLK is provided to an input of each of the receiver circuits 101, 103, 105, and 107. Each of the receiver circuits 101, 103, 105, and 107 generates a clock signal RDCLK, as described below. The master clock signal MSTCLK has the same frequency as the clock signals RDCLK.

In an embodiment, the master clock signal MSTCLK is derived from one of the clock signals RDCLK. For example, the clock signal RDCLK generated by receiver circuit 101 may be used as the master clock signal MSTCLK. In this example, the clock signal RDCLK generated by receiver circuit 101 is aligned with clock signal MSTCLK. In this example, receiver circuit 101 does not have the phase detector shown in FIG. 2 or the phase evaluation and phase adjustment circuitry shown in FIG. 5. According to another embodiment, external circuitry reduces jitter in one of the clock signals RDCLK to generate a clock signal that is used as MSTCLK. In this embodiment, additional phase adjustment circuitry is used to reduce the phase delay in MSTCLK generated by the external circuitry.

Receiver circuits 101, 103, 105, and 107 convert the 4 serial data signals DSINA, DSINB, DSINC, and DSIND into 4 sets of parallel data signals DPINA, DPINB, DPINC, and DPIND, respectively, in response to clock signal MSTCLK. Each set of parallel data signals DPINA, DPINB, DPINC, and DPIND includes 2 or more parallel signals.

Protocol logic circuit 110 generates 4 sets of parallel data signals DPOUTA, DPOUTB, DPOUTC, and DPOUTD. Each set of parallel data signals DPOUTA, DPOUTB, DPOUTC, and DPOUTD includes 2 or more parallel signals. Transmitter circuits 102, 104, 106, and 108 convert the 4 sets of parallel data signals DPOUTA, DPOUTB, DPOUTC, and DPOUTD into 4 serial data signals DSOUTA, DSOUTB, DSOUTC, and DSOUTD, respectively.

Figure 2:
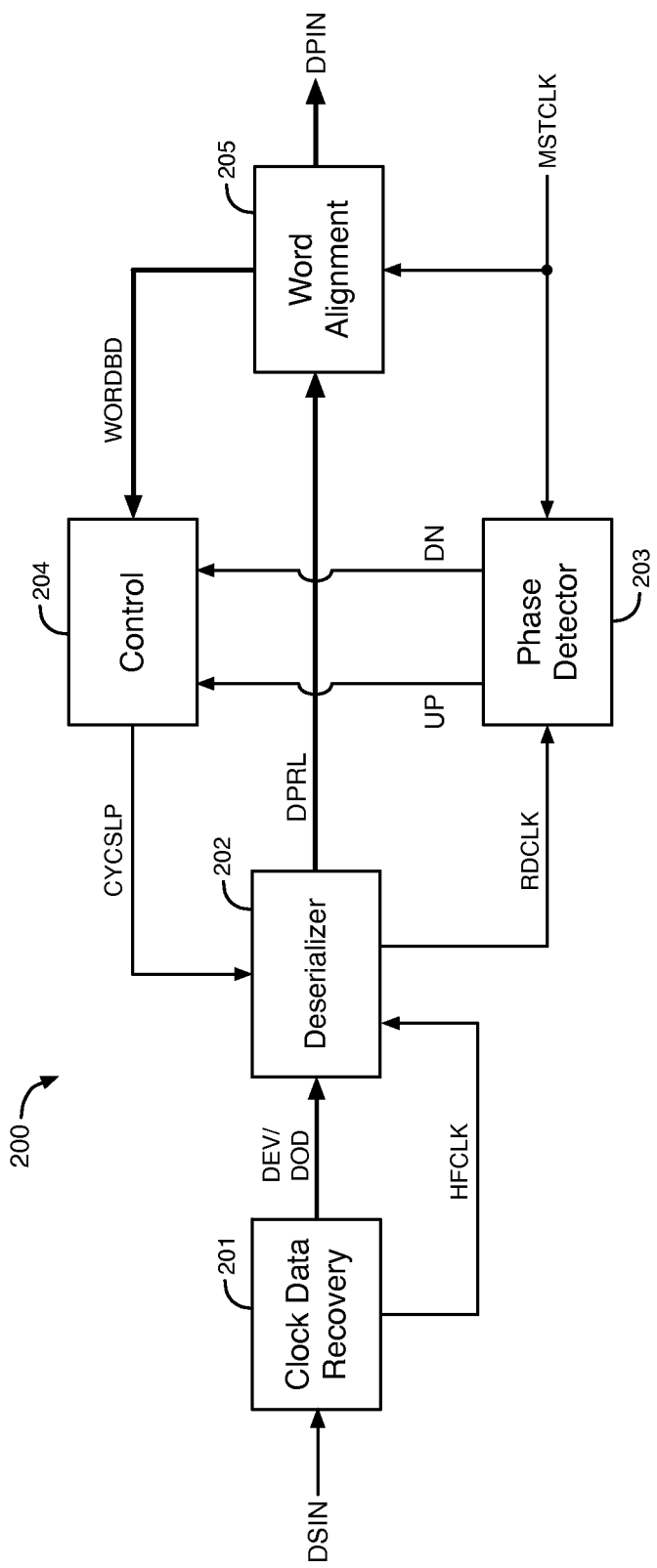
FIG. 2 illustrates an example of a receiver circuit for one lane, according to an embodiment of the present invention.

FIG. 2 illustrates an example of a receiver circuit 200, according to an embodiment of the present invention. Receiver circuit 200 is an example of each of the receiver circuits 101, 103, 105, and 107 shown in FIG. 1. In an embodiment, each of the receiver circuits 101, 103, 105, and 107 includes an instance of receiver circuit 200.

Receiver circuit 200 includes clock data recovery (CDR) circuit 201, deserializer circuit 202, phase detector circuit 203, control circuit 204, and word alignment circuit 205. A single serial data signal DSIN is provided to an input of clock data recovery circuit 201. Serial data signal DSIN contains serial bits, including data bits and protocol bits. Serial data signal DSIN may be, for example, one of serial data signals DSINA, DSINB, DSINC, and DSIND in a respective one of receiver circuits 101, 103, 105, and 107.

Clock data recovery circuit 201 generates a recovered clock signal HFCLK based on the serial data signal DSIN. Clock data recovery circuit 201 may also generate other recovered clock signals based on the serial data signal DSIN. Clock data recovery circuit 201 may generate the recovered clock signals using, for example, an oscillator circuit. An example of a clock data recovery circuit that may be used in clock data recovery circuit 201 is described in commonly-assigned U.S. patent application 2012/0063556, published Mar. 15, 2012, which is incorporated by reference herein in its entirety.

Clock data recovery circuit 201 includes a sampler circuit that converts serial data signal DSIN into even data signal DEV and odd data signal DOD. The DEV and DOD signals include bits that are sampled in even and odd bit periods, respectively, of serial data signal DSIN in response to clock signal HFCLK. The even data signal DEV and the odd data signal DOD are provided to inputs of deserializer circuit 202. Exemplary embodiments of deserializer circuit 202 are disclosed in commonly-assigned U.S. Pat. No. 7,982,639, issued Jul. 19, 2011, which is incorporated by reference herein in its entirety.

Figure 3:
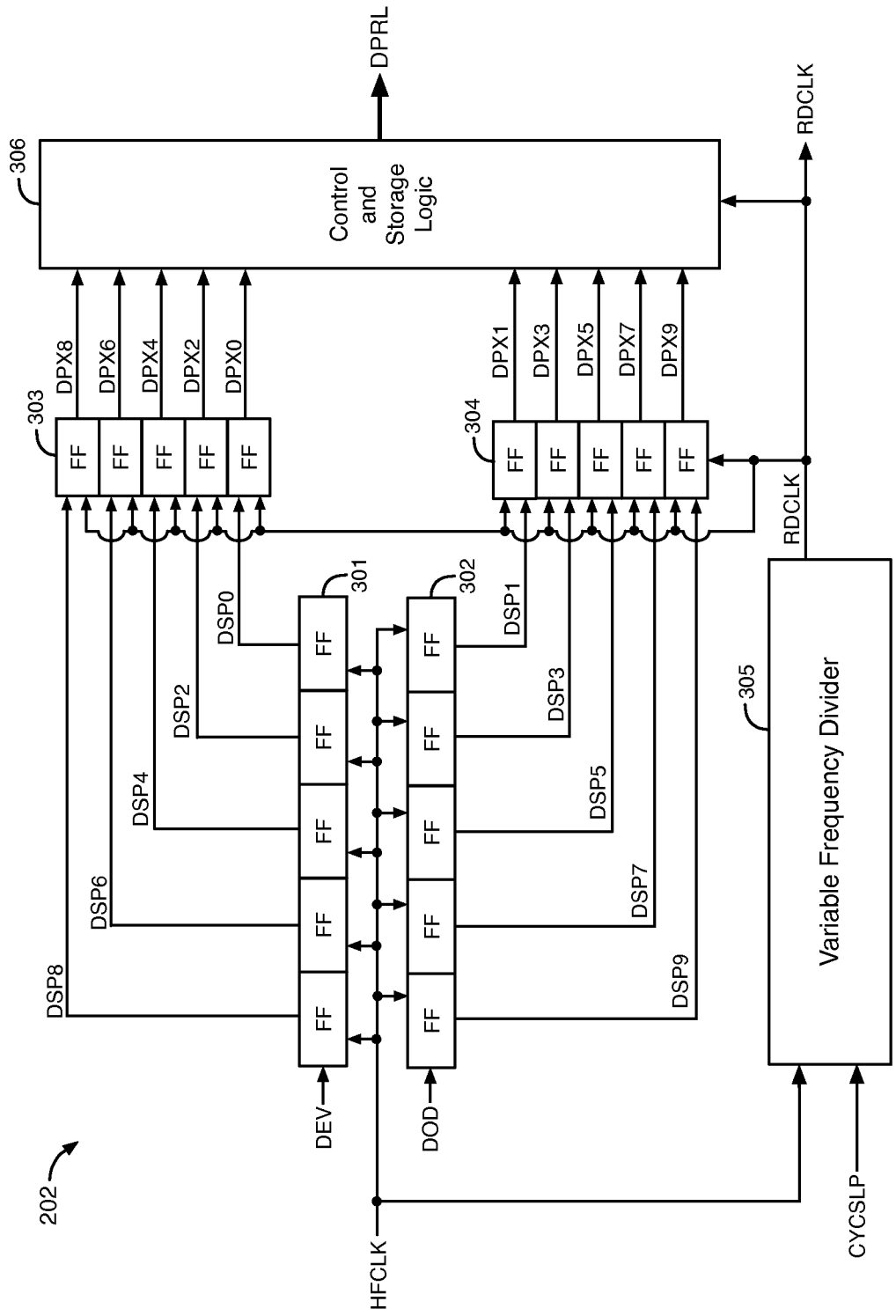
FIG. 3 illustrates an example of the deserializer circuit of FIG. 2, according to an embodiment of the present invention.

FIG. 3 illustrates an example of deserializer circuit 202, according to an embodiment of the present invention. Deserializer circuit 202 includes serial-in-parallel out (SIPO) shift register circuits 301-302, register circuits 303-304, variable frequency divider circuit 305, and control and storage logic circuit 306. Each of the SIPO shift register circuits 301 and 302 includes 5 flip-flop (FF) circuits that are coupled together in series. Each of register circuits 303 and 304 includes 5 flip-flop (FF) circuits. The flip-flop circuits are storage circuits.

Clock signal HFCLK is provided to a clock input of each of the 5 flip-flop circuits in each of the SIPO shift register circuits 301-302 and to an input of variable frequency divider circuit 305. The even data signal DEV and the odd data signal DOD generated by CDR circuit 201 are provided to inputs of SIPO shift register circuits 301 and 302, respectively.

Variable frequency divider circuit 305 generates a periodic synchronous clock signal RDCLK in response to clock signal HFCLK. Variable frequency divider circuit 305 divides the frequency of dual-edge clock signal HFCLK by 4 to generate the frequency of single edge clock signal RDCLK. Variable frequency divider circuit 305 causes the frequency of clock signal RDCLK to be one-fourth the frequency of clock signal HFCLK. Variable frequency divider circuit 305 causes clock signal RDCLK to have a 50% duty cycle. Clock signal RDCLK is also referred to as a low-speed clock signal, and clock signal HFCLK is also referred to as a high-speed clock signal. Deserializer circuit 202 performs a synchronous alignment of 8-bit transfer onto the RDCLK clock domain for each rising edge of RDCLK, as described below.

Deserializer circuit 202 has a serial-to-parallel converter circuit that converts the serial bits in the even and odd data signals DEV and DOD into parallel bits in parallel data signals DPRL in response to clock signal HFCLK. According to various embodiments, deserializer circuit 202 may convert data signals DEV and DOD into 4, 8, 16, 32, 64, or 128 parallel data signals DPRL.

In the example of FIG. 3, the serial-to-parallel converter circuit includes SIPO shift register circuits 301-302, register circuits 303-304, and control and storage logic circuit 306. SIPO shift register circuits 301-302 convert data signals DEV and DOD into 10 parallel data signals DSP0-DSP9. Even data signal DEV is provided to a data input of SIPO shift register circuit 301, and odd data signal DOD is provided to a data input of SIPO shift register circuit 302.

The bits indicated by data signal DEV are serially shifted into the 5 flip-flop circuits in SIPO shift register circuit 301 in response to clock signal HFCLK. An additional bit indicated by data signal DEV is serially shifted into SIPO shift register circuit 301 in response to each rising edge of clock signal HFCLK. The signals stored at the outputs of the 5 flip-flop circuits in SIPO shift register circuit 301 are referred to as signals DSP0, DSP2, DSP4, DSP6, and DSP8. The signals DSP0, DSP2, DSP4, DSP6, and DSP8 indicate 5 bits received from data signal DEV. Each of the signals DSP0, DSP2, DSP4, DSP6, and DSP8 is provided to a data input of a different one of the 5 flip-flops in register circuit 303, as shown in FIG. 3. Clock signal RDCLK is provided to a clock input of each of the 5 flip-flops in register circuit 303. The 5 flip-flops in register circuit 303 are single edge flip-flops that are responsive to each of the rising edges of clock signal RDCLK. The 5 flip-flops in register circuit 303 store the 5 bits indicated by signals DSP0, DSP2, DSP4, DSP6, and DSP8 at their outputs in signals DPX0, DPX2, DPX4, DPX6, and DPX8, respectively, in response to each rising edge in clock signal RDCLK.

The bits indicated by data signal DOD are serially shifted into the 5 flip-flop circuits in SIPO shift register circuit 302 in response to clock signal HFCLK. An additional bit indicated by data signal DOD is serially shifted into SIPO shift register circuit 302 in response to each rising edge of clock signal HFCLK. The signals stored at the outputs of the 5 flip-flop circuits in SIPO shift register circuit 302 are referred to as signals DSP1, DSP3, DSP5, DSP7, and DSP9. The signals DSP1, DSP3, DSP5, DSP7, and DSP9 indicate 5 bits received from data signal DOD. Each of the signals DSP1, DSP3, DSP5, DSP7, and DSP9 is provided to a data input of a different one of the 5 flip-flops in register circuit 304, as shown in FIG. 3. Clock signal RDCLK is provided to a clock input of each of the 5 flip-flops in register circuit 304. The 5 flip-flops in register circuit 304 are single edge flip-flops that are responsive to each of the rising edges of clock signal RDCLK. The 5 flip-flops in register circuit 304 store the 5 bits indicated by signals DSP1, DSP3, DSP5, DSP7, and DSP9 at their outputs in signals DPX1, DPX3, DPX5, DPX7, and DPX9, respectively, in response to each rising edge of clock signal RDCLK.

When the frequency of clock signal RDCLK is one-fourth the frequency of clock signal HFCLK, each period of clock signal RDCLK has the same duration as four periods of clock signal HFCLK. Therefore, the bit indicated by signal DPX0 is a duplicate of the bit that was indicated by signal DPX8 in the previous period of clock signal RDCLK, and the bit indicated by signal DPX1 is a duplicate of the bit that was indicated by signal DPX9 in the previous period of clock signal RDCLK. For example, if the data rate of data signals DEV and DOD is 8 Gbps, HFCLK is 4 GHz, and RDCLK is 1 GHz, circuits 303-304 provide 8 unique bits in signals DPX2-DPX9 in response to each rising edge of clock signal RDCLK.

Variable frequency divider circuit 305 also varies the period and the phase of clock signal RDCLK based on each pulse in a cycle slip signal CYCSLP. In response to each pulse in cycle slip signal CYCSLP, variable frequency divider circuit 305 increases the period of clock signal RDCLK by one period of clock signal HFCLK, generating one extended period of clock signal RDCLK that has the same duration as five periods of clock signal HFCLK. During the extended period of clock signal RDCLK, 5 new bits from signal DEV are serially shifted into shift register 301, and 5 new bits from signal DOD are serially shifted into shift register 302, before the next rising edge in clock signal RDCLK. As a result, the 10 bits indicated by signals DPX0-DPX9 following each extended period of clock signal RDCLK are unique with respect to the 10 bits indicated by signals DPX0-DPX9 in the previous period of clock signal RDCLK. Thus, the 10 bits indicated by signals DPX0-DPX9 following each extended period of clock signal RDCLK do not contain any duplicate bits.

Signals DPX0-DPX9 are provided to inputs of control and storage logic circuit 306. Control and storage logic circuit 306 generates parallel data signals DPRL based on signals DPX0-DPX9 in response to clock signal RDCLK, as described below.

Figure 4:
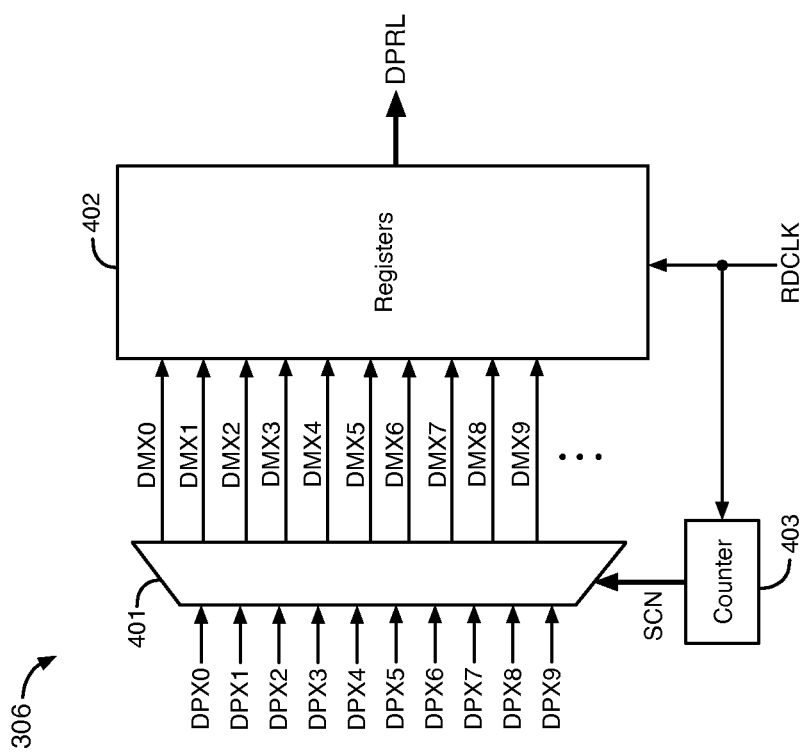
FIG. 4 illustrates an example of the control and storage logic circuit of FIG. 3, according to an embodiment of the present invention.

FIG. 4 illustrates an example of control and storage logic circuit 306, according to an embodiment of the present invention. Control and storage logic circuit 306 includes demultiplexer circuit 401, register circuits 402, and counter circuit 403. Counter circuit 403 generates select count signals SCN. Select count signals SCN are provided to select inputs of demultiplexer circuit 401. Counter circuit 403 varies the binary value of select count signals SCN in response to each rising edge of clock signal RDCLK.

The 10 output data signals DPX0-DPX9 of register circuits 303-304 are provided to 10 de-multiplexing inputs of demultiplexer circuit 401. Demultiplexer circuit 401 generates a multiple of 10 parallel output data signals, including for example, parallel output data signals DMX0-DMX9. For example, demultiplexer circuit 401 may generate 10, 20, 30, 40, 50, etc. parallel output data signals. Demultiplexer circuit 401 provides the bits indicated by data signals DPX0-DPX9 to each successive group of ten parallel output data signals DMX0-DMX9, etc. in response to select count signals SCN on a consecutive and recirculating basis.

As an example, the first set of ten parallel bits indicated by data signals DPX0-DPX9 are provided to output data signals DMX0-DMX9, respectively. The second set of ten parallel bits indicated by data signals DPX0-DPX9 are provided to output data signals DMX10-DMX19, respectively. The third set of ten parallel bits indicated by data signals DPX0-DPX9 are provided to output data signals DMX20-DMX29, respectively, and so on until parallel bits in signals DPX0-DPX9 have been provided to all of the parallel output data signals of demultiplexer circuit 401. Subsequently, the next set of ten parallel bits indicated by data signals DPX0-DPX9 are provided to output data signals DMX0-DMX9, respectively, and the process repeats as described above.

The parallel output data signals DMX0-DMX9, etc. of demultiplexer circuit 401 are provided to inputs of register circuits 402. Register circuits 402 include flip-flops that store the parallel output data signals DMX0-DMX9, etc. of demultiplexer circuit 401 in response to each rising edge of clock signal RDCLK. Register circuits 402 also include flip-flops that store the parallel output data signals DPRL in response to each rising edge of clock signal RDCLK. Register circuits 402 provide the 8 parallel bits indicated by only 8 parallel data signals of each set of 10 parallel output data signals of demultiplexer circuit 401 to parallel output data signals DPRL. Register circuits 402 do not provide the 2 bits to parallel output data signals DPRL that were received from signals DPX0-DPX1 in each set of 10 parallel output data signals of demultiplexer circuit 401.

For example, register circuits 402 provide only the parallel bits indicated by parallel data signals DMX2-DMX9, DMX12-DMX19, DMX22-DMX29, etc. to parallel output data signals DPRL. The bits indicated by the remaining parallel output data signals DMX0-DMX1, DMX10-DMX11, DMX20-DMX21, etc. of demultiplexer circuit 401 are not provided to any of the parallel output data signals DPRL. Thus, the bits indicated by parallel data signals DMX0-DMX1, DMX10-DMX11, DMX20-DMX21, etc. are dropped by deserializer circuit 202. Circuit 306 provides only the bits indicated by parallel data signals DPX2-DPX9 to parallel output data signals DPRL. The bits indicated by the other two parallel data signals DPX0-DPX1 are not provided to any of the parallel output data signals DPRL. When the preceding period of clock signal RDCLK is four times the period of clock signal HFCLK, the bits indicated by parallel data signals DPX0-DPX1 contain duplicate bits, and therefore, no new bits are dropped by circuit 202.

After a pulse in cycle slip signal CYCSLP, a period of clock signal RDCLK is extended to five times the period of clock signal HFCLK. When a period of clock signal RDCLK is five times the period of clock signal HFCLK, register circuits 303-304 generate 10 new bits in parallel data signals DPX0-DPX9 on the next rising edge of clock signal RDCLK, relative to the bits indicated by data signals DPX0-DPX9 in the preceding period of clock signal RDCLK. Thus, the bits indicated by parallel data signals DPX0-DPX1 contain two new bits that are not duplicates of bits that were indicated by any of data signals DPX0-DPX9 in the current or previous periods of clock signal RDCLK. The bits indicated by parallel data signals DPX0-DPX1 are not provided to any of the parallel output data signals DPRL, as described above. Thus, deserializer circuit 202 does not provide the two new bits indicated by parallel data signals DPX0-DPX1 to data signals DPRL in response to each pulse in signal CYCSLP. Therefore, these two bits are dropped. As a result, deserializer circuit 202 shifts the positions of the bits in parallel data signals DPRL by 2 bits in response to each pulse in signal CYCSLP.

Referring again to FIG. 2, master clock signal MSTCLK is provided to a first input of phase detector circuit 203. Clock signal RDCLK is provided to a second input of phase detector circuit 203. Phase detector circuit 203 generates two digital phase detection signals UP and DN based on the phase difference between clock signals MSTCLK and RDCLK. Phase detector circuit 203 generates a logic high pulse in phase detection signal UP during each period of clock signal MSTCLK when the phase of clock signal MSTCLK is ahead of the phase of clock signal RDCLK. Phase detector circuit 203 generates a logic high pulse in phase detection signal DN during each period of clock signal MSTCLK when the phase of clock signal MSTCLK is behind the phase of clock signal RDCLK. Phase detection signals UP and DN are provided to inputs of control circuit 204.

Figure 5:
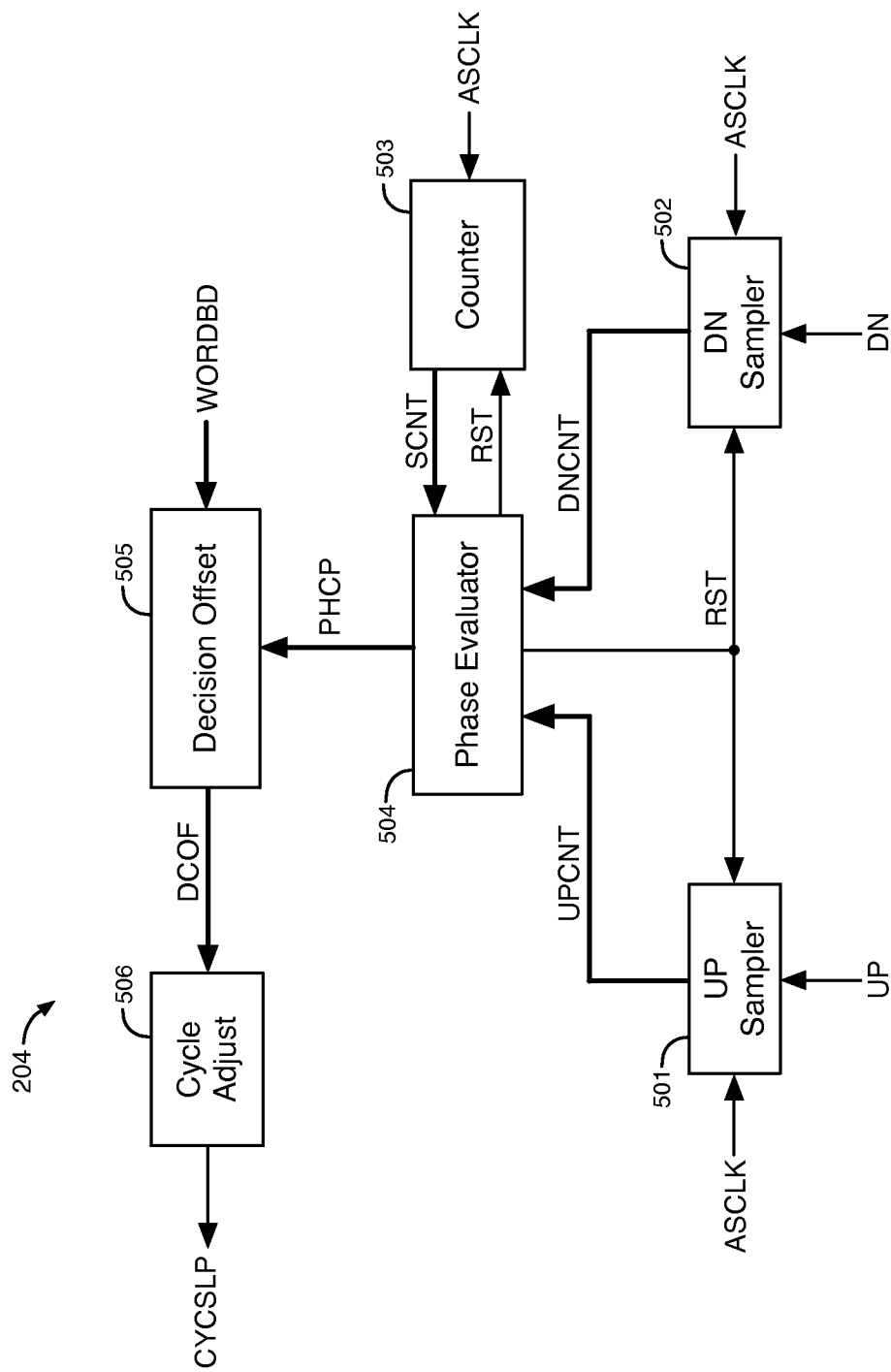
FIG. 5 illustrates an example of the control circuit of FIG. 2, according to an embodiment of the present invention.

FIG. 5 illustrates an example of control circuit 204, according to an embodiment of the present invention. Control circuit 204 includes UP sampler circuit 501, DN sampler circuit 502, counter circuit 503, phase evaluator circuit 504, decision offset circuit 505, and cycle adjust circuit 506. The phase detection signals UP and DN are provided to inputs of UP sampler circuit 501 and DN sampler circuit 502, respectively. A periodic clock signal ASCLK is provided to clock inputs of UP sampler circuit 501 and DN sampler circuit 502. Clock signal ASCLK is asynchronous with respect to master clock signal MSTCLK. A reset signal RST generated by phase evaluator circuit 504 is provided to inputs of UP sampler circuit 501, DN sampler circuit 502, and counter circuit 503. UP sampler circuit 501 generates digital count signals UPCNT, and DN sampler circuit 502 generates digital count signals DNCNT.

FIG. 6A illustrates an example of UP sampler circuit 501, according to an embodiment of the present invention. UP sampler circuit 501 includes register circuits 601-602 (e.g., flip-flops) and counter circuit 603. As shown in FIG. 6A, the phase detection signal UP is provided to an input of register circuit 601, reset signal RST is provided to the reset input of counter circuit 603, and clock signal ASCLK is provided to the clock inputs of register circuits 601-602 and counter circuit 603. Register 601 stores the value of phase detection signal UP in signal UPA in response to each rising edge in clock signal ASCLK. Register 602 stores the value of signal UPA in signal UPB in response to each rising edge in clock signal ASCLK. Registers 601-602 are metastable harden registers that remove glitches from phase detection signal UP to generate signal UPB.

Counter circuit 603 generates digital count signals UPCNT in response to clock signal ASCLK and in response to signal UPB. Counter circuit 603 resets the binary value of count signals UPCNT to zero in response to each rising edge in reset signal RST. Counter circuit 603 increases the binary value of the count signals UPCNT by 1 in response to each rising edge in clock signal ASCLK that occurs while signal UPB is in a logic high state. Counter circuit 603 maintains the binary value of the count signals UPCNT constant while signal UPB is in a logic low state.

Figure 7A:
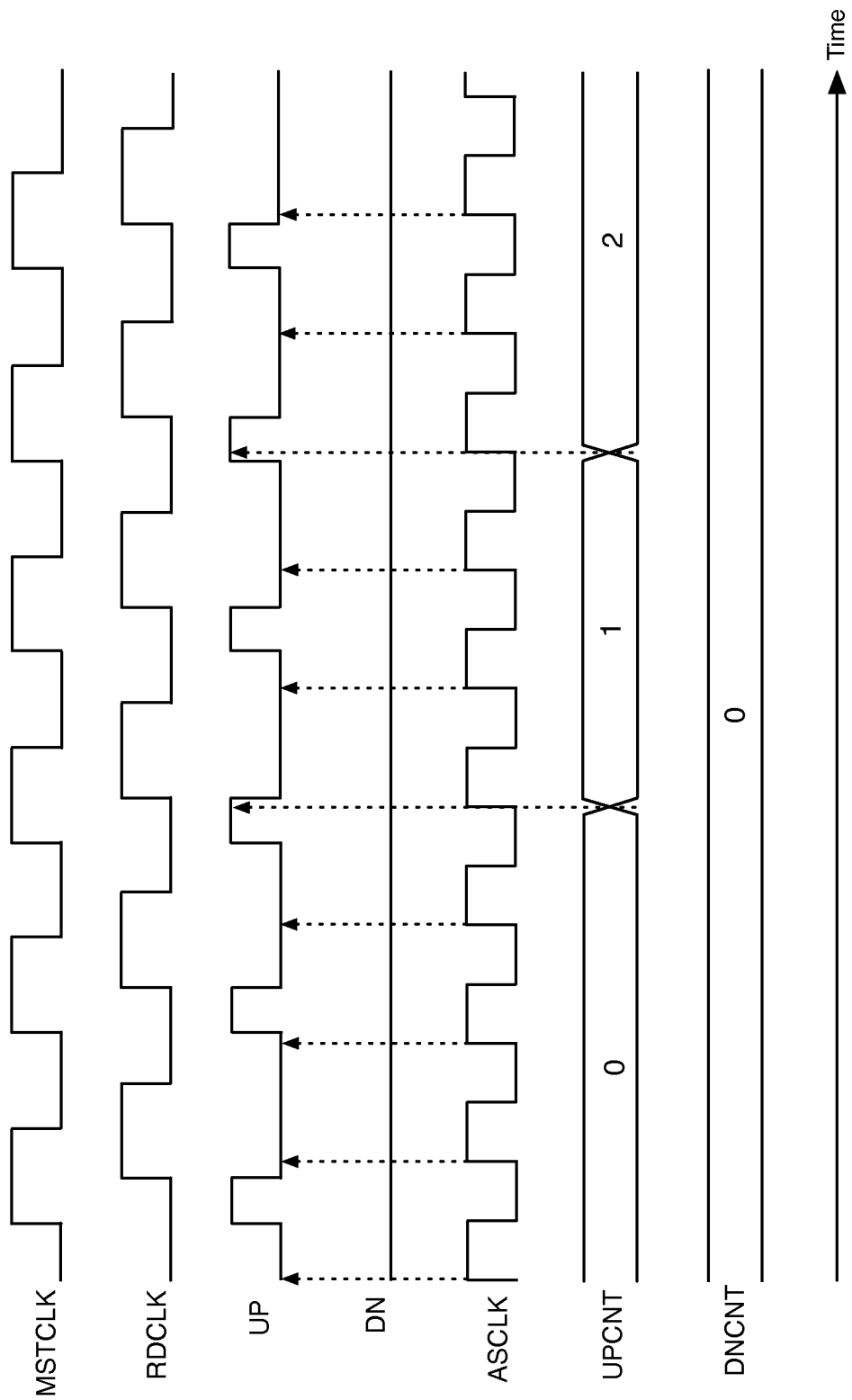
FIG. 7A illustrates exemplary waveforms for some of the signals shown in FIGS. 2 and 5 when the phase of the master clock signal is leading the phase of the low-speed clock signal, according to an embodiment of the present invention.

FIG. 7A illustrates exemplary waveforms for some of the signals shown in FIGS. 2 and 5 when the phase of clock signal MSTCLK is leading the phase of clock signal RDCLK. FIG. 7A shows exemplary waveforms for clock signals MSTCLK, RDCLK and ASCLK, phase detection signals UP and DN, count signals UPCNT, and count signals DNCNT. In the example of FIG. 7A, clock signals MSTCLK and RDCLK have the same frequencies, but the phase of clock signal MSTCLK is ahead of the phase of clock signal RDCLK. In the example of FIG. 7A, phase detector circuit 203 generates logic high pulses in phase detection signal UP.

Each logic high pulse in phase detection signal UP begins on a rising edge in clock signal MSTCLK that occurs when clock signal RDCLK is in a logic low state. Each logic high pulse in phase detection signal UP ends on a rising edge in clock signal RDCLK that occurs when clock signal MSTCLK is in a logic high state. Counter circuit 603 increases the binary value of the count signals UPCNT from 0 to 1 and then from 1 to 2, as shown in FIG. 7A, when rising edges in clock signal ASCLK coincide with logic high pulses in signal UP. Signal DN remains in a logic low state, and the binary value of count signals DNCNT remains at 0 in FIG. 7A.

FIG. 6B illustrates an example of DN sampler circuit 502, according to an embodiment of the present invention. DN sampler circuit 502 includes register circuits 611-612 (e.g., flip-flops) and counter circuit 613. As shown in FIG. 6B, the phase detection signal DN is provided to an input of register circuit 611, reset signal RST is provided to the reset input of counter circuit 613, and clock signal ASCLK is provided to the clock inputs of registers 611-612 and counter circuit 613. Register 611 stores the value of phase detection signal DN in response to each rising edge of clock signal ASCLK to generate signal DNA. Register 612 stores the value of signal DNA in response to each rising edge of clock signal ASCLK to generate signal DNB. Registers 611-612 are metastable harden registers that remove glitches from phase detection signal DN to generate signal DNB.

Counter circuit 613 generates digital count signals DNCNT in response to clock signal ASCLK and in response to signal DNB. Counter circuit 613 resets the binary value of count signals DNCNT to zero in response to each rising edge in reset signal RST. Counter circuit 613 increases the binary value of the count signals DNCNT by 1 in response to each rising edge in clock signal ASCLK that occurs while signal DNB is in a logic high state. Counter circuit 613 maintains the binary value of the count signals DNCNT constant while signal DNB is in a logic low state.

Figure 7B:
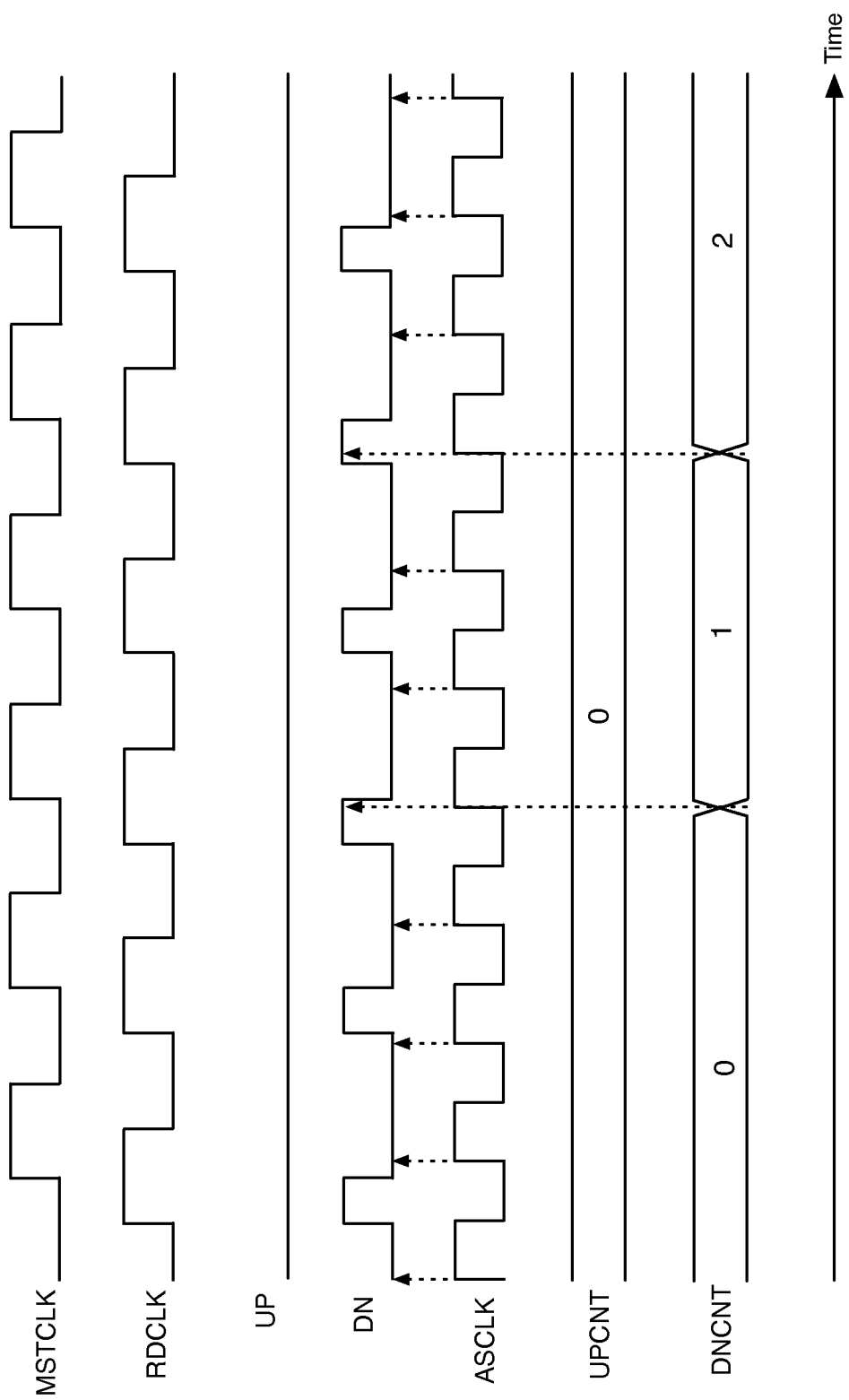
FIG. 7B illustrates exemplary waveforms for some of the signals shown in FIGS. 2 and 5 when the phase of the low-speed clock signal is leading the phase of the master clock signal, according to an embodiment of the present invention.

FIG. 7B illustrates exemplary waveforms for some of the signals shown in FIGS. 2 and 5 when the phase of clock signal RDCLK is leading the phase of clock signal MSTCLK. FIG. 7B shows exemplary waveforms for clock signals MSTCLK, RDCLK and ASCLK, phase detection signals UP and DN, count signals UPCNT, and count signals DNCNT. In the example of FIG. 7B, clock signals MSTCLK and RDCLK have the same frequencies, but the phase of clock signal RDCLK is ahead of the phase of clock signal MSTCLK. In the example of FIG. 7B, phase detector circuit 203 generates logic high pulses in phase detection signal DN.

Each logic high pulse in phase detection signal DN begins on a rising edge in clock signal RDCLK that occurs when clock signal MSTCLK is in a logic low state. Each logic high pulse in phase detection signal DN ends on a rising edge in clock signal MSTCLK that occurs when clock signal RDCLK is in a logic high state. Counter circuit 613 increases the binary value of count signals DNCNT from 0 to 1 and then from 1 to 2, as shown in FIG. 7B, when rising edges in clock signal ASCLK coincide with logic high pulses in signal DN. Signal UP remains in a logic low state, and the binary value of count signals UPCNT remains at 0 in FIG. 7B.

Referring again to FIG. 5, counter circuit 503 generates digital count signals SCNT in response to clock signal ASCLK. Reset signal RST is provided to counter circuit 503 from phase evaluator circuit 504. Counter circuit 503 resets the binary value of count signals SCNT to zero in response to each rising edge in reset signal RST. Counter circuit 503 increases the binary value of the count signals SCNT by 1 in response to each rising edge in clock signal ASCLK. The binary value of count signals SCNT indicates the number of rising edges in clock signal ASCLK that have occurred since the last rising edge in reset signal RST.

Count signals SCNT, UPCNT, and DNCNT are provided to inputs of phase evaluator circuit 504. Phase evaluator circuit 504 receives or stores a positive integer number S. The number S represents a minimum number of samples of the UP and DN signals that are used to determine the phase offset between clock signals MSTCLK and RDCLK. The number S also indicates a minimum number of periods of clock signal ASCLK that occur before phase evaluator circuit 504 updates its digital output signals PHCP based on the UPCNT or DNCNT signals. When the binary value of count signals SCNT is equal to or greater than the number S, phase evaluator circuit 504 determines an up offset value based on the UPCNT signals or a down offset value based on the DNCNT signals.

If the UPCNT signals have a non-zero binary value that is greater than a threshold when the binary value of count signals SCNT is equal to the number S, phase evaluator circuit 504 divides the binary value of the UPCNT signals by the binary value of the SCNT signals to generate an up offset value. The up offset value indicates the fraction of the rising edges of clock signal ASCLK that signal UP was in a logic high state among the S number of rising edges of clock signal ASCLK. Phase evaluator circuit 504 then causes the binary value of its output signals PHCP to indicate the up offset value. The threshold equals a minimum number that is selected to filter out phase noise.

If the DNCNT signals have a non-zero binary value that is greater than the threshold when the binary value of count signals SCNT is equal to the number S, phase evaluator circuit 504 divides the binary value of the DNCNT signals by the binary value of the SCNT signals to generate a down offset value. The down offset value indicates the fraction of the rising edges of clock signal ASCLK that signal DN was in a logic high state among the S number of rising edges of clock signal ASCLK. Phase evaluator circuit 504 then causes the binary value of its output signals PHCP to indicate the down offset value. The binary value of the PHCP signals may, for example, be negative to indicate a down offset value and positive to indicate an up offset value. In an embodiment, the binary value of signals PHCP may indicate a percentage that corresponds to the fractional up or down offset value.

If the UPCNT signals and the DNCNT signals both have binary values that are less than the threshold when the binary value of count signals SCNT is equal to the number S, phase evaluator circuit 504 causes the binary value of its output signals PHCP to equal zero. After count signals SCNT equal the number S, phase evaluator circuit 504 updates its output signals PHCP based on count signals UPCNT and/or DNCNT, and then generates a logic high pulse in the reset signal RST. Counter circuits 603, 613, and 503 reset the binary values of count signals UPCNT, DNCNT, and SCNT, respectively, to zero in response to each logic high pulse in the reset signal RST.

Signals PHCP are provided to inputs of decision offset circuit 505. According to some embodiments described herein, for example, with respect to FIGS. 13-14, one or more word boundary signals WORDBD are provided to additional inputs of decision offset circuit 505, as shown in FIG. 5. According to other embodiments described herein, for example, with respect to FIGS. 10 and 12, word boundary signals WORDBD are not provided to inputs of decision offset circuit 505.

In embodiments in which the word boundary signals WORDBD are not provided to inputs of decision offset circuit 505, the decision offset circuit 505 generates decision offset signals DCOF based only on the values of the output signals PHCP of phase evaluator circuit 504. Decision offset circuit 505 converts the up or down offset value indicated by signals PHCP into a positive integer number V. Decision offset circuit 505 then causes the decision offset signals DCOF to indicate the number V. If the signals PHCP indicate an up offset value U (e.g., a positive number), then decision offset circuit 505 causes the number V to equal the up offset value U multiplied by the number M of parallel data signals DPRL generated by deserializer circuit 202 (i.e., $V=U \times M$). If the signals PHCP indicate a down offset value D (e.g., a negative number), then decision offset circuit 505 generates the number V based on the down offset value D and the number M of parallel data signals DPRL generated by deserializer circuit 202, such that $V=(1+D) \times M$.

For example, if deserializer circuit 202 generates 16 parallel signals DPRL for 16-bit data words, and signals PHCP indicate an up offset value of $\frac{1}{4}$, then decision offset circuit 505 generates a value of $\frac{1}{4} \times 16=4$ in decision offset signals DCOF. As another example, if deserializer circuit 202 generates 16 parallel signals DPRL, and signals PHCP indicate a down offset value of $-\frac{3}{8}$, then decision offset circuit 505 generates a value of 10 in decision offset signals DCOF that is based on $(1-\frac{3}{8}) \times 16=10$.

Decision offset signals DCOF are provided to inputs of cycle adjust circuit 506. Cycle adjust circuit 506 generates pulses in its digital output signal CYCSLP based on the number V indicated by the decision offset signals DCOF. In an embodiment, cycle adjust circuit 506 generates a V/2 number of logic high pulses in signal CYCSLP. Each logic high pulse includes a rising edge in signal CYCSLP followed by a falling edge in signal CYCSLP. In this embodiment, the number of logic high pulses generated in signal CYCSLP equals the number V indicated by the decision offset signals DCOF divided by 2. In some embodiments, cycle adjust circuit 506 causes each of the pulses generated in signal CYCSLP to be separated by a minimum amount of time that depends on the amount of time for variable frequency divider circuit 305 to respond to a pulse in signal CYCSLP.

Referring again to FIG. 3, signal CYCSLP is provided to an input of variable frequency divider circuit 305. As described above, variable frequency divider circuit 305 divides the frequency of clock signal HFCLK by 4 to generate the frequency of clock signal RDCLK. In response to each pulse in the cycle slip signal CYCSLP, one period of clock signal RDCLK is extended to five times the period of clock signal HFCLK, which causes an adjustment to the phase of clock signal RDCLK.

In response to the UP and DN phase detection signals indicating that the phase difference between clock signals RDCLK and MSTCLK is more than a predefined phase difference, control circuit 204 generates one or more pulses in cycle slip signal CYCSLP to adjust the phase of clock signal RDCLK. The threshold used by phase evaluator circuit 504 described above is based on the predefined phase difference. Control circuit 204 continues to generate pulses in cycle slip signal CYCSLP, until the UP and DN phase detection signals indicate that the difference between the phases of clock signals RDCLK and MSTCLK is less than the predefined phase difference.

As the phases of clock signals RDCLK and MSTCLK move closer to alignment, the pulses in the UP signal or the pulses in the DN signal become narrower, until the UPCNT signals or the DNCNT signals, respectively, are less than the threshold after an S number of samples. When the UPCNT signals and the DNCNT signals are less than the threshold after an S number of samples, control circuit 204 does not generate pulses in the cycle slip signal CYCSLP, and variable frequency divider circuit 305 causes the phase and the frequency of clock signal RDCLK to remain constant.

Each of the receiver circuits 101, 103, 105, and 107 generates a synchronous clock signal RDCLK that is aligned to the master clock signal MSTCLK within a phase offset. As a result, the data bits indicated by each of the 4 sets of parallel data signals DPINA, DPINB, DPINC, and DPIND are aligned with each other without skew, as described in more detail below.

In the embodiment shown in and described with respect to FIG. 3, deserializer circuit 202 drops two bits from a set of 10 bits received in data signals DEV and DOD in response to each pulse in signal CYCSLP. Thus, in response to each pulse in signal CYCSLP, deserializer circuit 202 provides only 8 bits of a set of 10 bits received in data signals DEV and DOD to parallel data signals DPRL, causing the positions of the bits in each data word indicated by the parallel data signals DPRL to be adjusted by two bits.

As an example, if data signals DEV and DOD contain 8-bit data words, where the bits in each data word are numbered 0-7 (i.e., bit 0 is the first bit in each data word, bit 1 is the second bit in each data word, etc.), deserializer circuit 202 may adjust the word boundary of the bits in 8 parallel data signals DPRL0-DPRL7 (i.e., signals DPRL) from bits 6, 7, 0, 1, 2, 3, 4, 5 to bits 0, 1, 2, 3, 4, 5, 6, 7, respectively, in response to a pulse in signal CYCSLP. As another example, if data signals DEV and DOD contain 8-bit data words, where the bits in each data word are numbered 0-7, deserializer circuit 202 may adjust the word boundary of the bits in 8 parallel data signals DPRL0-DPRL7 from bits 4, 5, 6, 7, 0, 1, 2, 3, to bits 0, 1, 2, 3, 4, 5, 6, 7, respectively, in response to two pulses in signal CYCSLP. The embodiment of FIG. 3 may, for example, be used in receiver circuits that receive data signals having 4-bit, 8-bit, 16-bit, 32-bit, 64-bit, or 128-bit data words.

According to other embodiments of deserializer circuit 202, any number of one, two, three, or more bits are dropped from each N-bit data word received in data signals DEV and DOD in response to each pulse in signal CYCSLP to adjust the word boundary of the bits in the parallel data signals DPRL. As specific examples that are not intended to be limiting, deserializer circuit 202 may provide only 8 bits of 9 bits, 16 bits of 17 bits, or 32 bits of 33 bits received in data signals DEV and DOD to parallel data signals DPRL, in response to each pulse in signal CYCSLP, if the serial input data has 8-bit, 16-bit, or 32 bit data words, respectively. According to alternative embodiments of deserializer circuit 202, any number of one, two, three, or more duplicate bits are added to each N-bit data word received in data signals DEV and DOD in response to each pulse in signal CYCSLP to adjust the word boundary of the bits in the parallel data signals DPRL.

Figure 8B:
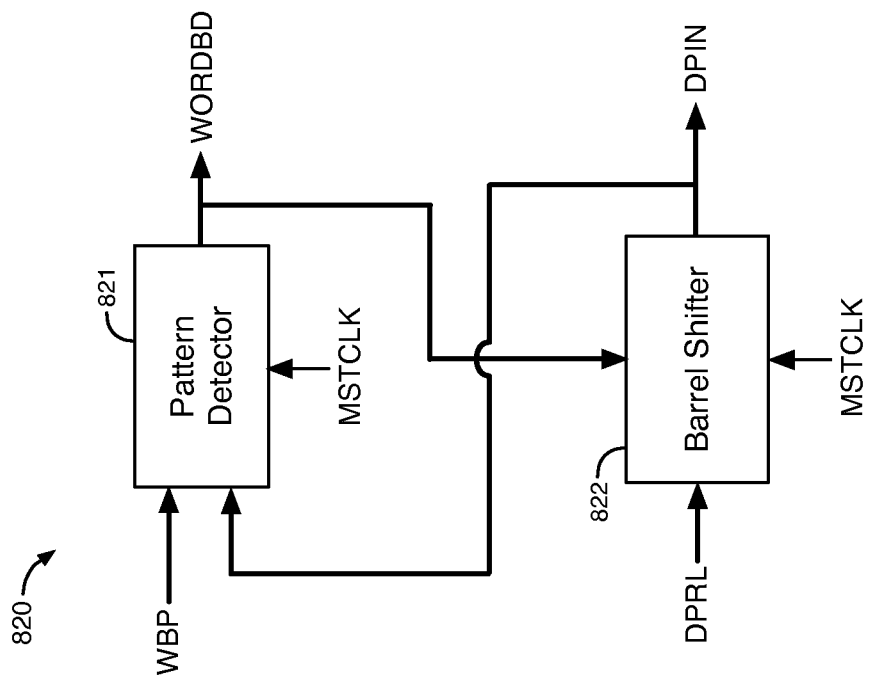
FIG. 8B illustrates another example of a word alignment circuit, according to an alternative embodiment of the present invention.
Figure 8A:
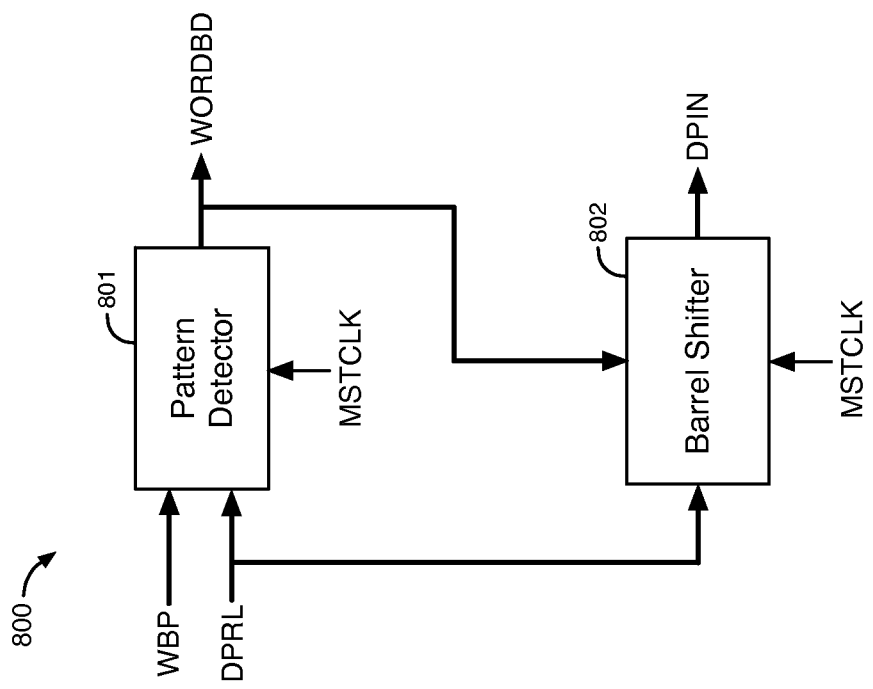
FIG. 8A illustrates an example of a word alignment circuit, according to an embodiment of the present invention.

FIG. 8A illustrates an example of a word alignment circuit 800, according to an embodiment of the present invention. Word alignment circuit 800 is an example of word alignment circuit 205 shown in FIG. 2. Word alignment circuit 800 includes pattern detector circuit 801 and barrel shifter circuit 802. Parallel data signals DPRL are provided from outputs of deserializer circuit 202 to inputs of pattern detector circuit 801 and to inputs of barrel shifter circuit 802, in the embodiment of FIG. 8A. The master clock signal MSTCLK is provided to inputs of pattern detector circuit 801 and barrel shifter circuit 802. Word boundary pattern signals WBP are provided to inputs of pattern detector circuit 801.

Pattern detector circuit 801 generates word boundary signals WORDBD that indicate the bit position where each of the data words begins in the parallel data signals DPRL. Barrel shifter circuit 802 generates parallel data signals DPIN. Barrel shifter circuit 802 generates bits in parallel data signals DPIN that equal the values of corresponding bits in parallel data signals DPRL. Barrel shifter circuit 802 is configurable to shift the positions of the bits received in parallel data signals DPRL based on signals WORDBD to cause the first bit in each data word to be in the first one of parallel data signals DPIN (i.e., in signal DPIN0) and consecutive bits in each data word to be in respectively consecutive ones of parallel data signals DPIN (i.e., signals DPIN1, DPIN2, etc.).

FIG. 8B illustrates another example of a word alignment circuit 820, according to an alternative embodiment of the present invention. Word alignment circuit 820 is another example of word alignment circuit 205 shown in FIG. 2. Word alignment circuit 820 includes pattern detector circuit 821 and barrel shifter circuit 822. Parallel data signals DPRL are provided from outputs of deserializer circuit 202 to inputs of barrel shifter circuit 822. The master clock signal MSTCLK is provided to inputs of pattern detector circuit 821 and barrel shifter circuit 822. Word boundary pattern signals WBP are provided to inputs of pattern detector circuit 821.

Parallel data signals DPIN are provided to inputs of pattern detector circuit 821. Pattern detector circuit 821 generates word boundary signals WORDBD that indicate the bit position where each of the data words begins (i.e., the word boundary) in the parallel data signals DPIN. Pattern detector circuit 821 performs a serial search for the bit position of the word boundary in signals DPIN.

Barrel shifter circuit 822 generates parallel data signals DPIN. Barrel shifter circuit 822 generates bits in parallel data signals DPIN that equal the values of corresponding bits in parallel data signals DPRL. Barrel shifter circuit 822 is configurable to shift the positions of the bits received in parallel data signals DPRL based on signals WORDBD to cause the first bit in each data word to be in the first one of parallel data signals DPIN and consecutive bits in each data word to be in respectively consecutive ones of parallel data signals DPIN.

Figure 9:
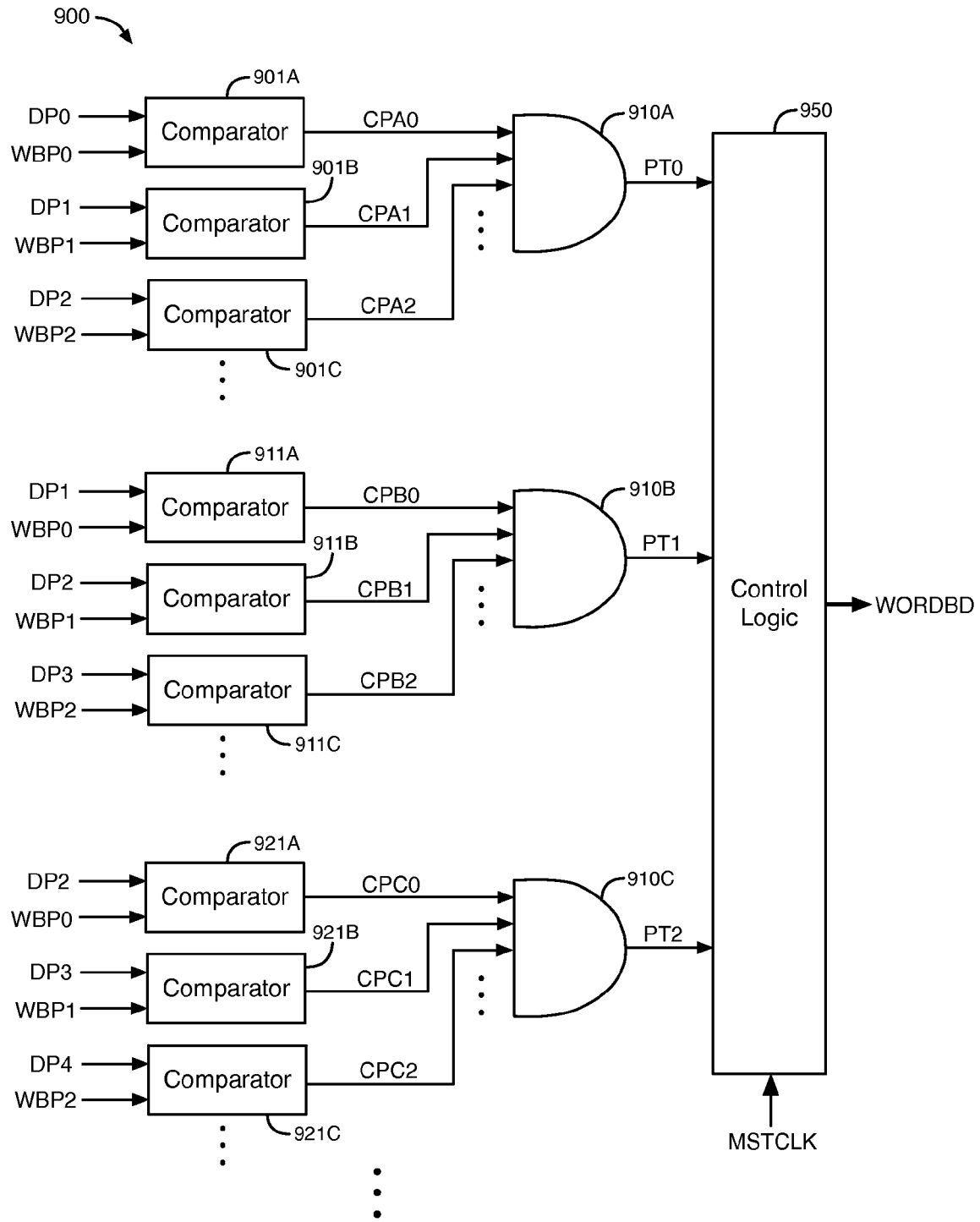
FIG. 9 illustrates an example of a pattern detector circuit, according to an embodiment of the present invention.

FIG. 9 illustrates an embodiment of a pattern detector circuit 900, according to an embodiment of the present invention. Pattern detector circuit 900 is an example of pattern detector circuit 801 and pattern detector circuit 821. Pattern detector circuit 900 includes control logic circuit 950, AND logic gate circuits 910, and comparator circuits 901, 911, and 921. If deserializer circuit 202 generates an M number of parallel data signals DPRL for M-bit data words received in signal DSIN, then pattern detector circuit 900 includes M sets of comparator circuits 901, 911, 921, etc. Also, pattern detector circuit 900 includes an M number of comparator circuits in each of the M sets of comparator circuits, including an M number of comparator circuits 901A, 901B, 901C, etc., an M number of comparator circuits 911A, 911B, 911C, etc., and an M number of comparator circuits 921A, 921B, 921C, etc. Pattern detector circuit 900 also includes an M number of AND logic gate circuits 910A, 910B, 910C, etc.

An M number of parallel data signals DP0, DP1, DP2, DP3, DP4, ... DP(M−1) are provided to inputs of pattern detector circuit 900. In pattern detector circuit 801, parallel data signals DP0, DP1, DP2, DP3, DP4, ... DP(M−1) are parallel data signals DPRL. In pattern detector circuit 821, parallel data signals DP0, DP1, DP2, DP3, DP4, ... DP(M−1) are parallel data signals DPIN. An M number of word boundary pattern signals WBP0, WBP1, WBP2, WBP3, WBP4, ... WBP(M−1) (i.e., signals WBP) are provided to inputs of pattern detector circuit 900.

Comparators 901 compare parallel data signals DP0, DP1, DP2, DP3, DP4, ... DP(M−1) to the word boundary pattern signals WBP0, WBP1, WBP2, WBP3, WBP4, ... WBP(M−1) to generate comparison signals CPA0, CPA1, CPA2, CPA3, CPA4, ... CPA(M−1), respectively. Comparators 911 compare parallel data signals DP1, DP2, DP3, DP4, ... , DP(M−1), DP0 to the word boundary pattern signals WBP0, WBP1, WBP2, WBP3, ... WBP(M−2), WBP(M−1) to generate comparison signals CPB0, CPB1, CPB2, CPB3, ... CPB(M−2), CPB(M−1), respectively. Comparators 921 compare parallel data signals DP2, DP3, DP4, ... , DP(M−1), DP0, DP1 to the word boundary pattern signals WBP0, WBP1, WBP2, ... WBP(M−3), WBP(M−2), WBP(M−1) to generate comparison signals CPC0, CPC1, CPC2, ... CPC(M−3), CPC(M−2), CPC(M−1), respectively.

AND logic gate circuits 910A, 910B, 910C, etc. generate digital output signals PT0, PT1, PT2, etc. by performing AND logic functions on input signals CPA0-CPA(M−1), CPB0-CPB(M−1), CPC0-CPC(M−1), etc., respectively. Control logic circuit 950 generates the word boundary signals WORDBD based on the digital output signals PT0, PT1, PT2, etc. of AND logic gate circuits 910A, 910B, 910C, etc.

Various serial data signal communication protocols use more bits than the minimum number needed to represent the data being communicated. The extra bits include protocol bits that are used to indicate word alignment boundaries for block synchronization. Word boundary pattern signals WBP have fixed values that are set to a predefined digital pattern. The predefined digital pattern of the word boundary pattern signals WBP is selected to match the protocol bits that indicate the word boundary in a stream of data bits. Pattern detector circuit 900 compares signals WBP0-WBP(M−1) to the bits starting at each of the M bit positions in the parallel data signals DP0-DP(M−1) to determine the bit position of the word boundary. The word boundary indicates the bit position where each data word in the stream of bits begins. M is the number of parallel data signals DPRL and the number of bits in each data word.

Control logic circuit 950 determines the word boundary based on signals PT0, PT1, PT2, etc. Pattern detector circuit 900 causes only one of the output signals PT0, PT1, PT2, etc. of the AND logic gates 910 to be in a logic high state. If signal PT0 is in a logic high state, then the word boundary begins at the bit position corresponding to signal DP0. If signal PT1 is in a logic high state, then the word boundary begins at the bit position corresponding to signal DP1. If signal PT2 is in a logic high state, then the word boundary begins at the bit position corresponding to signal DP2. If the output signal of one of the other AND logic gates 910 is in a logic high state, then the word boundary begins at the bit position indicated by the corresponding data signal DP provided to the first comparator in the corresponding set of comparators. Control logic circuit 950 generates the word boundary signals WORDBD. Control logic circuit 950 causes the digital values of the word boundary signals WORDBD to indicate the bit position in the parallel data signals DP0-DP(M−1) where the word boundary begins.

Figure 10:
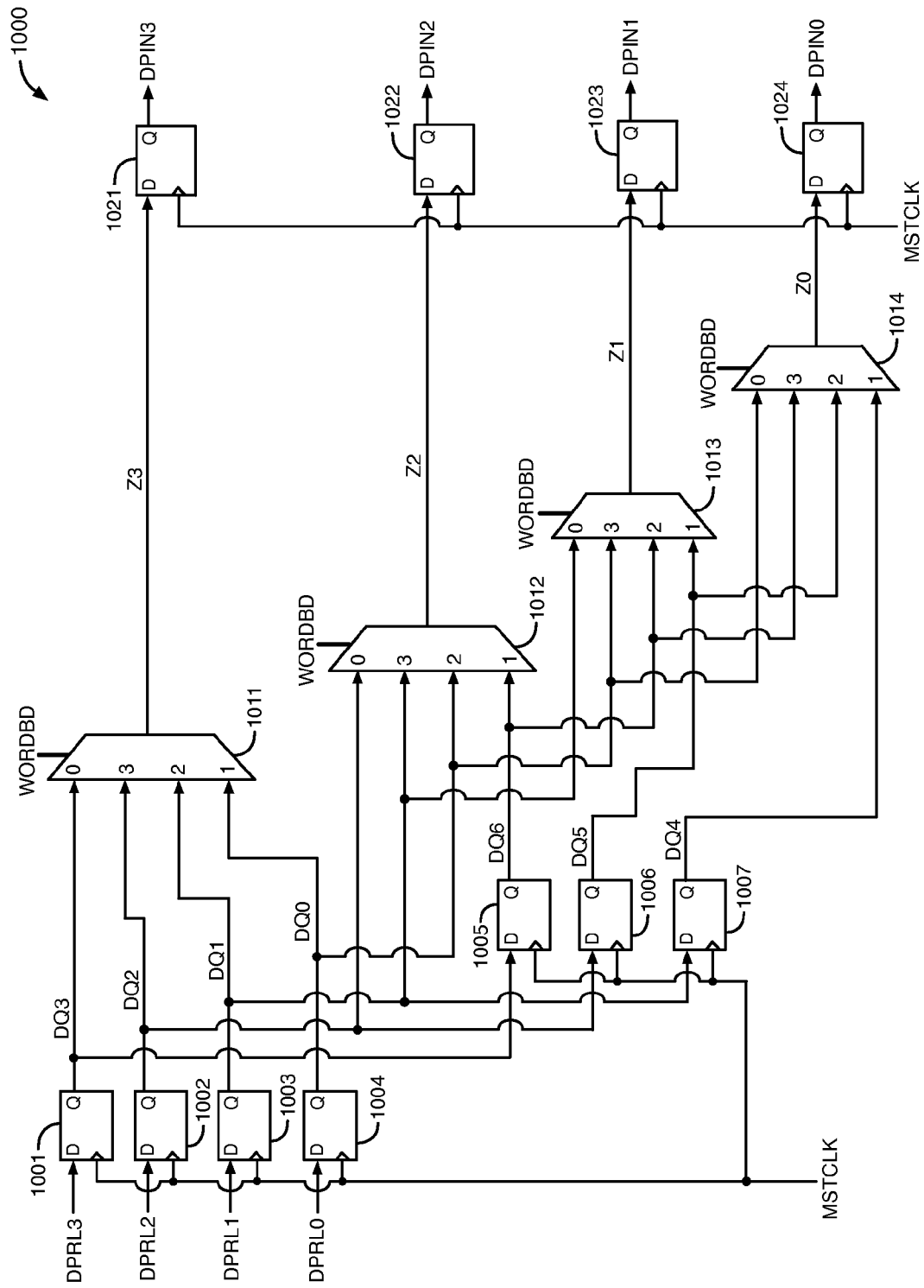
FIG. 10 illustrates an example of the barrel shifter circuits of FIGS. 8A and 8B, according to an embodiment of the present invention.

FIG. 10 illustrates an example of a barrel shifter circuit 1000, according to an embodiment of the present invention. Barrel shifter circuit 1000 is an example of barrel shifter circuit 802 in FIG. 8A. Barrel shifter circuit 1000 is also an example of barrel shifter circuit 822 in FIG. 8B. Barrel shifter circuit 1000 includes D flip-flop circuits 1001-1007, multiplexer circuits 1011-1014, and D flip-flop circuits 1021-1024.

In the embodiment of FIG. 10, deserializer circuit 202 generates 4 data signals DPRL0-DPRL3 that indicate 4-bit data words. Signal DPRL0 indicates the first bit received (i.e., the oldest bit) from the serial data signal, signal DPRL1 indicates the second bit received from the serial data signal, signal DPRL2 indicates the third bit received from the serial data signal, and signal DPRL3 indicates the fourth bit received from the serial data signal (i.e., the most recently received bit). Data signals DPRL3, DPRL2, DPRL1, and DPRL0 are provided to the D inputs of flip-flop circuits 1001, 1002, 1003, and 1004, respectively. The master clock signal MSTCLK is provided to the clock input of each of the flip-flop circuits 1001-1007 and 1021-1024. Flip-flop circuits 1001, 1002, 1003, and 1004 store the values of data signals DPRL3, DPRL2, DPRL1, and DPRL0 at their Q outputs in data signals DQ3, DQ2, DQ1, and DQ0, respectively, in response to each rising edge of clock signal MSTCLK.

Data signals DQ3, DQ2, and DQ1 are provided to the D inputs of flip-flop circuits 1005, 1006, and 1007, respectively. Flip-flop circuits 1005, 1006, and 1007 store the values of data signals DQ3, DQ2, and DQ1 at their Q outputs in data signals DQ6, DQ5, and DQ4, respectively, in response to each rising edge of clock signal MSTCLK.

Data signals DQ3, DQ2, DQ1, and DQ0 are provided to the 0, 3, 2, and 1 multiplexing inputs of multiplexer circuit 1011, respectively. Data signals DQ2, DQ1, DQ0, and DQ6 are provided to the 0, 3, 2, and 1 multiplexing inputs of multiplexer circuit 1012, respectively. Data signals DQ1, DQ0, DQ6, and DQ5 are provided to the 0, 3, 2, and 1 multiplexing inputs of multiplexer circuit 1013, respectively. Data signals DQ0, DQ6, DQ5, and DQ4 are provided to the 0, 3, 2, and 1 multiplexing inputs of multiplexer circuit 1014, respectively. The word boundary signals WORDBD are provided to the select inputs of each of the multiplexer circuits 1011-1014.

Multiplexer circuits 1011-1014 generate data signals Z3, Z2, Z1, and Z0, respectively, at their outputs based on the values of the WORDBD signals and the signals at their multiplexing inputs. Data signals Z3, Z2, Z1, and Z0 are provided to the D inputs of flip-flop circuits 1021-1024, respectively. Flip-flop circuits 1021, 1022, 1023, and 1024 store the values of data signals Z3, Z2, Z1, and Z0 at their Q outputs in signals DPIN3, DPIN2, DPIN1, and DPIN0, respectively, in response to each rising edge of clock signal MSTCLK.

If the binary value of signals WORDBD equals 0 indicating that the word boundary begins at bit position 0, then multiplexer circuits 1011-1014 provide the values of data signals DQ3, DQ2, DQ1, and DQ0 to signals Z3, Z2, Z1, and Z0, respectively.

If the word boundary begins at bit positions 1, 2, or 3, then barrel shifter circuit 1000 adjusts the positions of the bits in data signals DPIN3, DPIN2, DPIN1, and DPIN0 relative to the positions of the bits in data signals DPRL3, DPRL2, DPRL1, and DPRL0. For example, if the binary value of signals WORDBD equals 1 indicating that the word boundary begins at bit position 1 in data signal DPRL1, then multiplexer circuits 1011-1014 provide the values of data signals DQ0, DQ6, DQ5, and DQ4 to signals Z3, Z2, Z1, and Z0, respectively. As a result, the bit position of each bit in data signals DPIN0-DPIN3 shifts by one bit relative to the equivalent bit in data signals DPRL0-DPRL3 to align the first bit of each 4-bit data word in data signal DPIN0.

If the binary value of signals WORDBD equals 2 indicating that the word boundary begins at bit position 2 in signal DPRL2, then multiplexer circuits 1011-1014 provide the values of data signals DQ1, DQ0, DQ6, and DQ5 to signals Z3, Z2, Z1, and Z0, respectively. As a result, the bit position of each bit in data signals DPIN0-DPIN3 shifts by two bits relative to the equivalent bit in data signals DPRL0-DPRL3 to align the first bit of each 4-bit data word in data signal DPIN0.

If the binary value of signals WORDBD equals 3 indicating that the word boundary begins at bit position 3 in signal DPRL3, then multiplexer circuits 1011-1014 provide the values of data signals DQ2, DQ1, DQ0, and DQ6 to signals Z3, Z2, Z1, and Z0, respectively. As a result, the bit position of each bit in data signals DPIN0-DPIN3 shifts by three bits relative to the equivalent bit in data signals DPRL0-DPRL3 to align the first bit of each 4-bit data word in data signal DPIN0.

Figure 11:
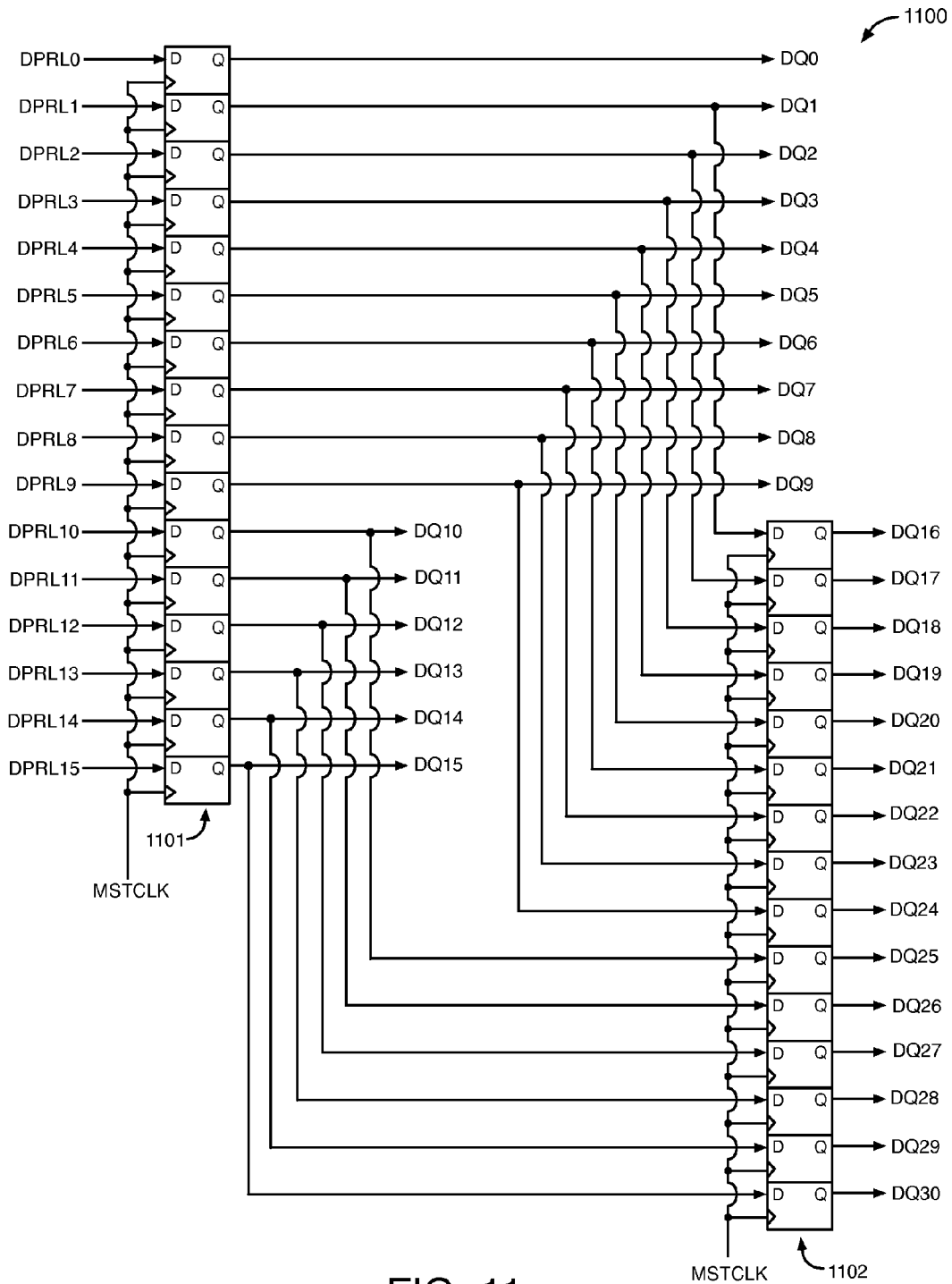
FIG. 11 illustrates an example of a storage circuit in the barrel shifter circuits of FIGS. 8A and 8B, according to an embodiment of the present invention.
Figure 12:
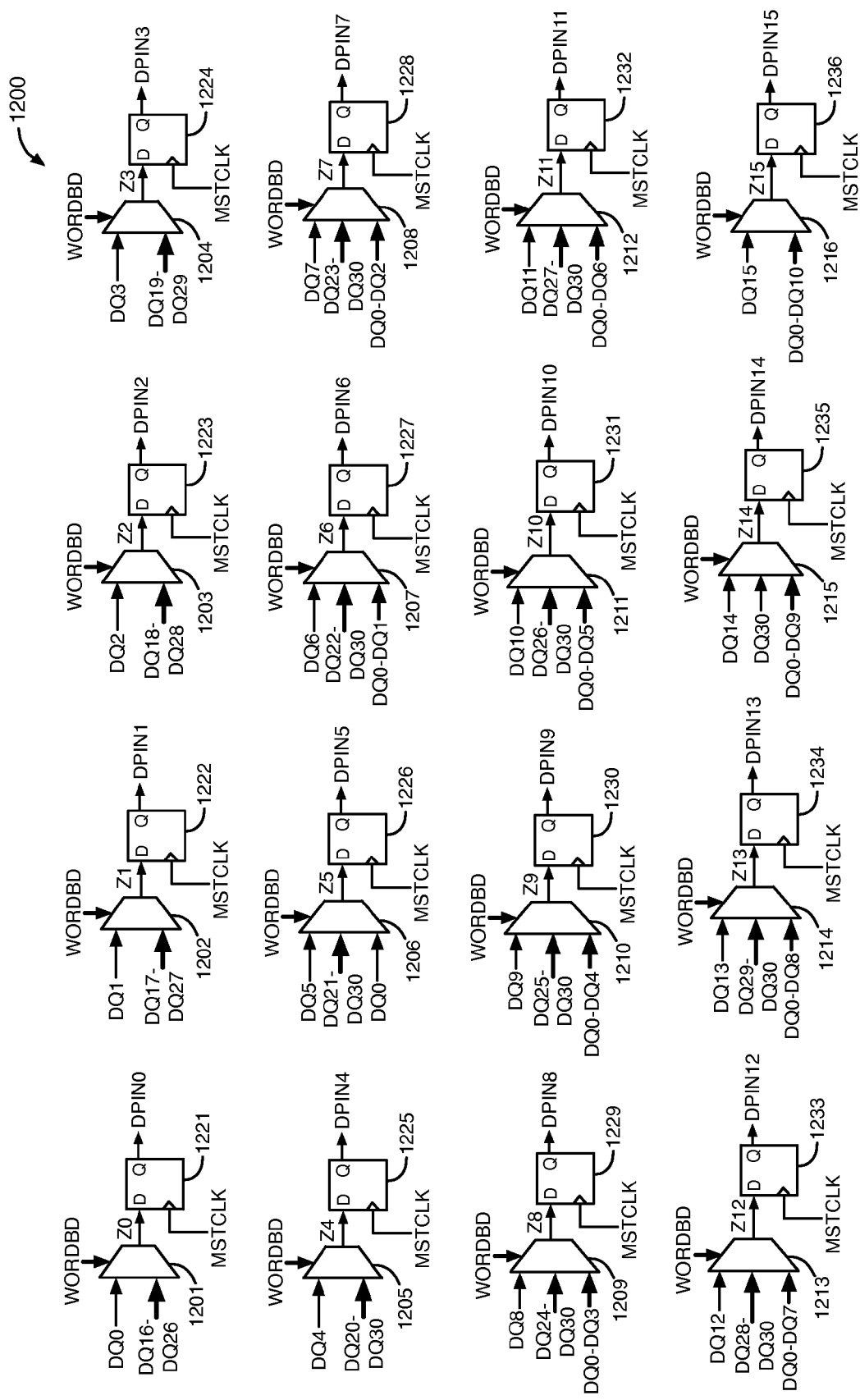
FIG. 12 illustrates an example of a selector circuit in the barrel shifter circuits of FIGS. 8A and 8B, according to an embodiment of the present invention.

FIGS. 11 and 12 illustrate another example of a barrel shifter circuit, according to an alternative embodiment of the present invention. The barrel shifter circuit of FIGS. 11-12 is an example of barrel shifter circuit 802 in FIG. 8A. The barrel shifter circuit of FIGS. 11-12 is also an example of barrel shifter circuit 822 in FIG. 8B.

FIG. 11 illustrates an example of a storage circuit 1100 in the barrel shifter circuits of FIGS. 8A and 8B, according to an embodiment of the present invention. The storage circuit 1100 includes 16 D flip-flop circuits 1101 and 15 D flip-flop circuit 1102. In the embodiment of FIG. 11, deserializer circuit 202 generates 16 parallel data output signals DPRL that contain 16-bit data words. Parallel data signals DPRL are referred to as data signals DPRL0-DPRL15 in FIG. 11. Signal DPRL0 indicates the first bit received from the serial data signal (i.e., the oldest bit), signals DPRL1-DPRL14 indicate the respective second through fifteenth bits received from the serial data signal, and signal DPRL15 indicates the most recently received bit from the serial data signal.

Data signals DPRL0-DPRL15 are provided to the D inputs of the 16 flip-flop circuits 1101. The master clock signal is provided to the clock input of each of the 31 flip-flop circuits 1101 and 1102. Flip-flop circuits 1101-1102 are single edge flip-flops. Flip-flop circuits 1101 store the values of data signals DPRL0-DPRL15 at their Q outputs in data signals DQ0-DQ15, respectively, in response to each rising edge of clock signal MSTCLK. Data signals DQ1-DQ15 are provided to the D inputs of the 15 flip-flop circuits 1102. Flip-flop circuits 1102 store the values of data signals DQ1-DQ15 at their Q outputs in data signals DQ16-DQ30, respectively, in response to each rising edge of clock signal MSTCLK.

FIG. 12 illustrates an example of a selector circuit 1200, according to an embodiment of the present invention. The barrel shifter circuit of FIGS. 11-12 includes storage circuit 1100 and selector circuit 1200. Selector circuit 1200 includes 16 multiplexer circuits 1201-1216 and 16 D flip-flop circuits 1221-1236. A different set of twelve of the 31 data signals DQ0-DQ30 are provided to 12 multiplexing inputs of each of the 16 multiplexer circuits 1201-1216, as shown in FIG. 12. Master clock signal MSTCLK is provided to the clock input of each of flip-flop circuits 1221-1236. Flip-flop circuits 1221-1236 are single edge flip-flops. The word boundary signals WORDBD are provided to the select inputs of each of the multiplexer circuits 1201-1216.

Multiplexer circuits 1201-1216 generate data signals Z0-Z15, respectively, at their outputs. Each of the multiplexer circuits 1201-1216 provides the value of one of the data signals at its 12 multiplexing inputs to its output as a respective one of data signals Z0-Z15 based on the word boundary signals WORDBD. Flip-flop circuits 1221-1236 store the values of data signals Z0-Z15 at their Q outputs in data signals DPIN0-DPIN15, respectively, in response to each rising edge of clock signal MSTCLK. In the embodiment of FIG. 12, data signals DPIN0-DPIN15 correspond to data signals DPIN shown in FIG. 2.

Selector circuit 1200 is configurable to shift the positions of the bits received in data signals DPRL0-DPRL15 by 0, 1, 2, 3, 4, 5, 6, 7, 8, 9, 10, or 11 bits to align the first bit of each 16-bit data word in data signal DPIN0. Selector circuit 1200 is configurable to shift the positions of the bits received in data signals DPRL0-DPRL15 by a maximum of 11 bits to generate the bits in data signals DPIN0-DPIN15. Selector circuit 1200 can be used in an embodiment of receiver circuit 200 in which the word boundaries of the data words in parallel data signals DPRL have a maximum offset of up to 11 bits relative to the first parallel data signal DPRL0.

If the binary value of signals WORDBD indicates that the word boundary begins at bit position 0 in signal DPRL0, then multiplexer circuits 1201-1216 provide the values of data signals DQ0-DQ15 to signals Z0-Z15, respectively. As a result, the bit positions of the bits in data signals DPIN0-DPIN15 are the same as the bit positions of the equivalent bits received in data signals DPRL0-DPRL15, respectively.

If the word boundary begins at one of bit positions 1-11, then selector circuit 1200 adjusts the positions of the bits in data signals DPIN0-DPIN15 relative to the positions of the bits in data signals DPRL0-DPRL15. For example, if the binary value of signals WORDBD indicates that the word boundary begins at bit position 1 in signal DPRL1, then multiplexer circuits 1201-1216 provide the values of data signals DQ16-DQ30 and DQ0 to signals Z0-Z15, respectively. As a result, the bit position of each bit in data signals DPIN0-DPIN15 shifts by one bit relative to the equivalent bit in data signals DPRL0-DPRL15 to align the first bit of each 16-bit data word in data signal DPIN0.

If the binary value of signals WORDBD indicates that the word boundary begins at bit position 2 in signal DPRL2, then multiplexer circuits 1201-1216 provide the values of data signals DQ17-DQ30 and DQ0-DQ1 to signals Z0-Z15, respectively. As a result, the bit position of each bit in data signals DPIN0-DPIN15 shifts by 2 bits relative to the equivalent bit in data signals DPRL0-DPRL15 to align the first bit of each 16-bit data word in data signal DPIN0.

If the binary value of signals WORDBD indicates that the word boundary begins at bit position 3, 4, 5, 6, 7, 8, 9, 10, or 11 in a respective one of signals DPRL3-DPRL11, then selector circuit 1200 shifts the bit position of each bit in data signals DPIN by 3, 4, 5, 6, 7, 8, 9, 10, or 11 bits, respectively, relative to the equivalent bit in data signals DPRL to align the first bit of each 16-bit data word in data signal DPIN0. Selector circuit 1200 provides the values of one set of 16 data signals DQ18-DQ30 and DQ0-DQ2, DQ19-DQ30 and DQ0-DQ3, DQ20-DQ30 and DQ0-DQ4, DQ21-DQ30 and DQ0-DQ5, DQ22-DQ30 and DQ0-DQ6, DQ23-DQ30 and DQ0-DQ7, DQ24-DQ30 and DQ0-DQ8, DQ25-DQ30 and DQ0-DQ9, or DQ26-DQ30 and DQ0-DQ10 to the 16 data signals DPIN0-DPIN15, respectively, based on signals WORDBD indicating that the word boundary begins at a respective bit position 3, 4, 5, 6, 7, 8, 9, 10, or 11.

Figure 13:
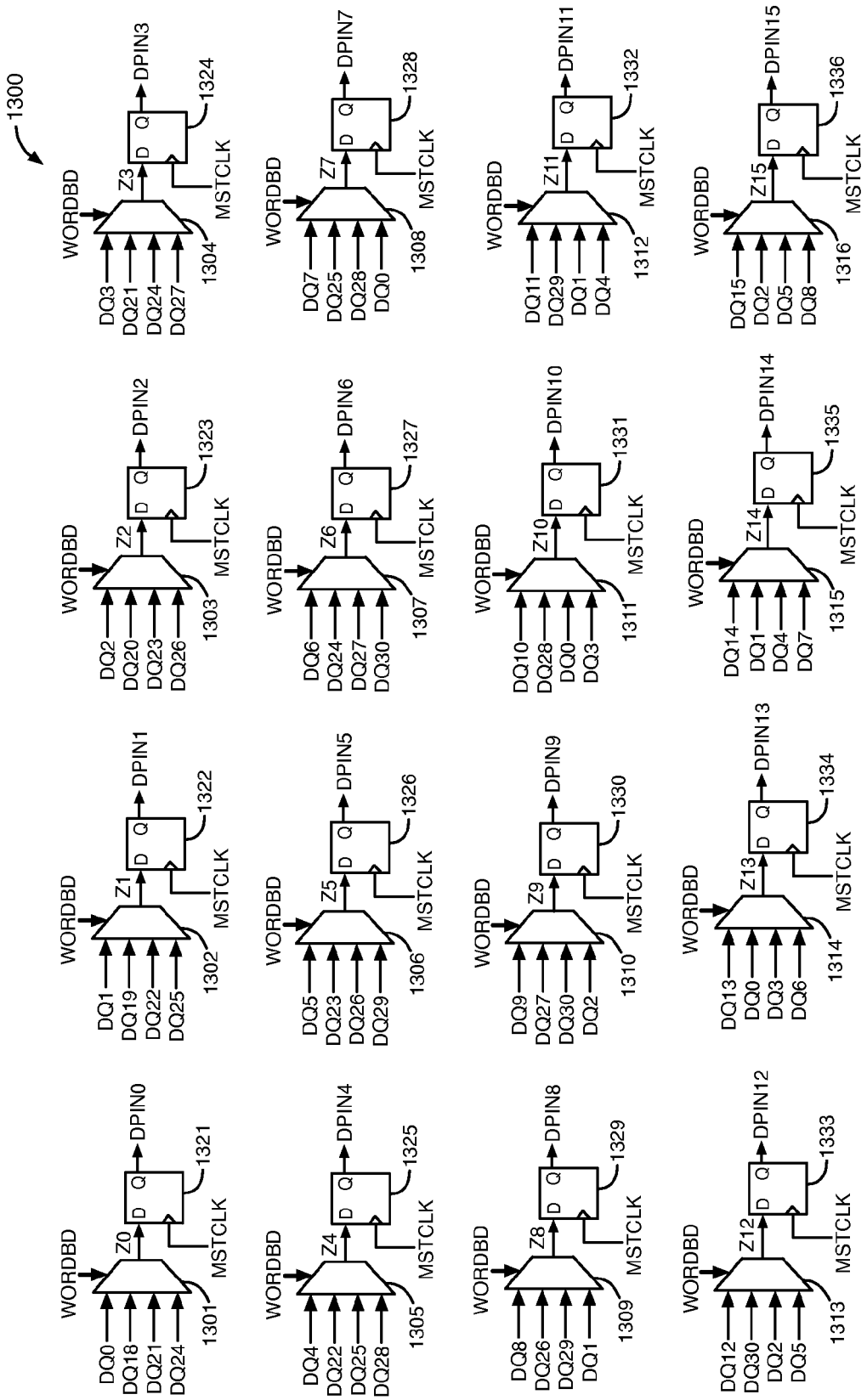
FIG. 13 illustrates another example of a selector circuit in the barrel shifter circuits of FIGS. 8A and 8B, according to an alternative embodiment of the present invention.

FIGS. 11 and 13 illustrate another example of a barrel shifter circuit, according to another alternative embodiment of the present invention. The barrel shifter circuit of FIGS. 11 and 13 is an example of barrel shifter circuit 802 in FIG. 8A. The barrel shifter circuit of FIGS. 11 and 13 is also an example of barrel shifter circuit 822 in FIG. 8B.

FIG. 13 illustrates another example of a selector circuit 1300, according to an alternative embodiment of the present invention. The barrel shifter circuit of FIGS. 11 and 13 includes storage circuit 1100 and selector circuit 1300. Selector circuit 1300 includes 16 multiplexer circuits 1301-1316 and 16 D flip-flop circuits 1321-1336. Four of the 16 data signals DQ0-DQ30 generated by storage circuit 1100 are provided to 4 multiplexing inputs of each of the 16 multiplexer circuits 1301-1316, as shown in FIG. 13. Master clock signal MSTCLK is provided to the clock input of each of flip-flop circuits 1321-1336. Flip-flop circuits 1321-1336 are single edge flip-flops. The word boundary signals WORDBD are provided to the select inputs of each of the multiplexer circuits 1301-1316.

Multiplexer circuits 1301-1316 generate data signals Z0-Z15, respectively, at their outputs. Each of the multiplexer circuits 1301-1316 provides the value of one of the 4 data signals at its 4 multiplexing inputs to its output as a respective one of data signals Z0-Z15 based on the word boundary signals WORDBD. Flip-flop circuits 1321-1336 store the values of data signals Z0-Z15 at their Q outputs in data signals DPIN0-DPIN15, respectively, in response to each rising edge of clock signal MSTCLK. In the embodiment of FIG. 13, data signals DPIN0-DPIN15 correspond to data signals DPIN shown in FIG. 2.

Selector circuit 1300 is configurable to shift the positions of the bits received in data signals DPRL0-DPRL15 by 0, 3, 6, or 9 bits to align the first bit of each 16-bit data word in data signal DPIN0. Selector circuit 1300 is configurable to shift the positions of the bits received in data signals DPRL0-DPRL15 by a maximum of 9 bits to generate the bits in data signals DPIN0-DPIN15. Selector circuit 1300 is used in an embodiment of receiver circuit 200 in which the word boundaries of the data words in parallel data signals DPRL have an offset of 0, 3, 6, or 9 bits relative to the first parallel data signal DPRL0 after being adjusted by deserializer circuit 202 and control circuit 204 in response to signals WORDBD, as described below.

If the binary value of signals WORDBD indicates that the word boundary begins at bit position 0 in signal DPRL0, then multiplexer circuits 1301-1316 provide the values of data signals DQ0-DQ15 to signals Z0-Z15, respectively. As a result, the bit positions of the bits in data signals DPIN0-DPIN15 are the same as the bit positions of the equivalent bits in data signals DPRL0-DPRL15, respectively.

If the word boundary begins at bit positions 3, 6, or 9, then selector circuit 1300 adjusts the positions of the bits in data signals DPIN0-DPIN15 relative to the positions of the bits in data signals DPRL0-DPRL15. For example, if the binary value of signals WORDBD indicates that the word boundary begins at bit position 3 in signal DPRL3, then multiplexer circuits 1301-1316 provide the values of data signals DQ18-DQ30 and DQ0-DQ2 to signals Z0-Z15, respectively. As a result, the bit position of each bit in data signals DPIN0-DPIN15 shifts by 3 bits relative to the equivalent bit in data signals DPRL0-DPRL15 to align the first bit of each 16-bit data word in data signal DPIN0.

If the binary value of signals WORDBD indicates that the word boundary begins at bit position 6 in signal DPRL6, then multiplexer circuits 1301-1316 provide the values of data signals DQ21-DQ30 and DQ0-DQ5 to signals Z0-Z15, respectively. As a result, the bit position of each bit in data signals DPIN0-DPIN15 shifts by 6 bits relative to the equivalent bit in data signals DPRL0-DPRL15 to align the first bit of each 16-bit data word in data signal DPIN0.

If the binary value of signals WORDBD indicates that the word boundary begins at bit position 9 in signal DPRL9, then multiplexer circuits 1301-1316 provide the values of data signals DQ24-DQ30 and DQ0-DQ8 to signals Z0-Z15, respectively. As a result, the bit position of each bit in data signals DPIN0-DPIN15 shifts by 9 bits relative to the equivalent bit in data signals DPRL0-DPRL15 to align the first bit of each 16-bit data word in data signal DPIN0.

The four parallel data signals at the multiplexing inputs of each of the multiplexer circuits 1301-1316 correspond to every third parallel data signal within a range of 10 of the 16 total parallel data signals DPRL. Thus, multiplexer circuits 1301-1316 each have a granularity of 3 bits. According to additional embodiments, barrel shifter circuits 802 and 822 may include multiplexer circuits that receive only every other parallel data signal, only every fourth parallel data signal, only every fifth parallel data signal, etc., which correspond to granularities of 2 bits, 4 bits, 5 bits, etc., respectively.

Figure 14:
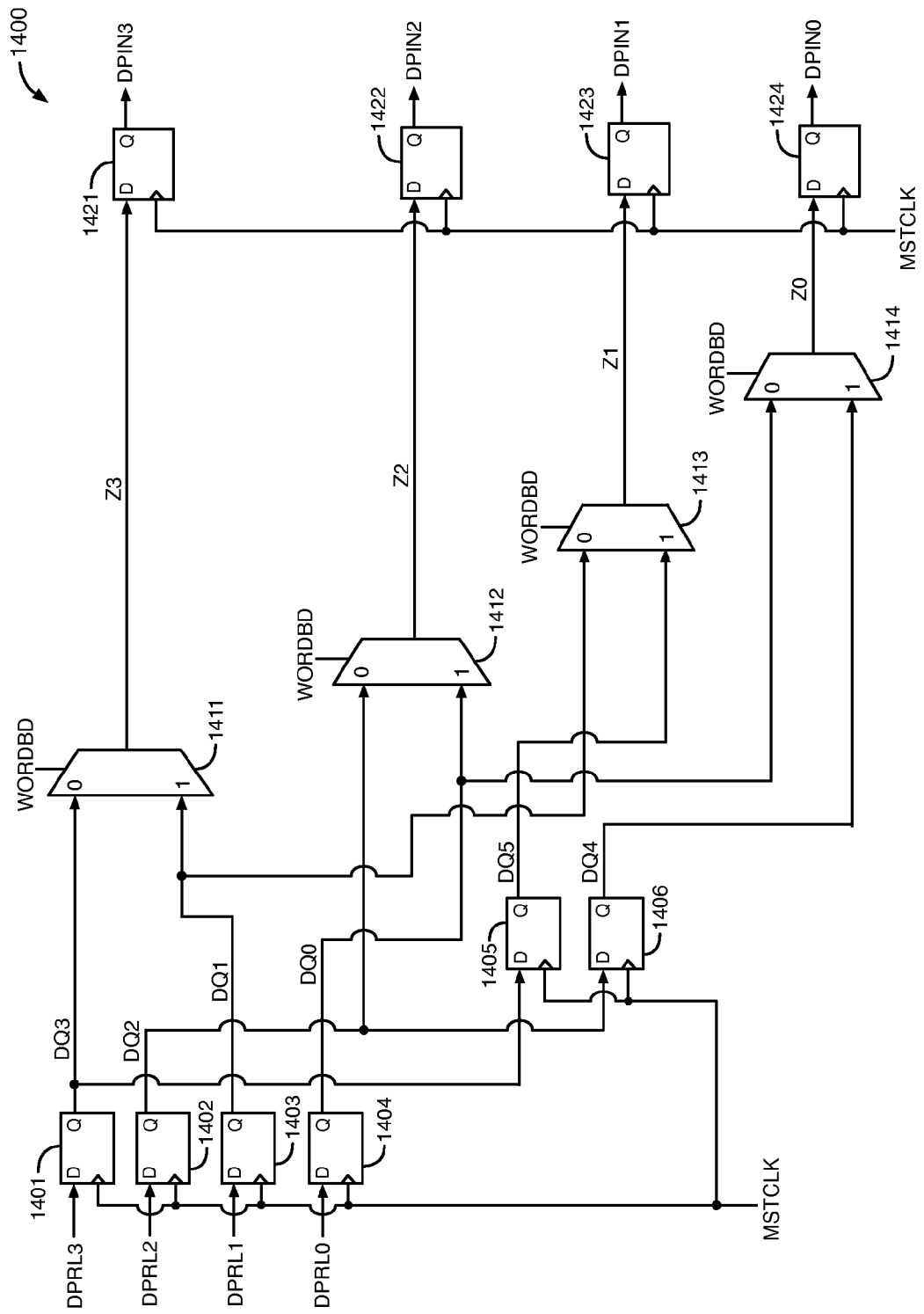
FIG. 14 illustrates another example of the barrel shifter circuits of FIGS. 8A and 8B, according to an alternative embodiment of the present invention.

FIG. 14 illustrates an example of a barrel shifter circuit 1400, according to an embodiment of the present invention. Barrel shifter circuit 1400 is an example of barrel shifter circuit 802 in FIG. 8A. Barrel shifter circuit 1400 is also an example of barrel shifter circuit 822 in FIG. 8B. Barrel shifter circuit 1400 includes D flip-flop circuits 1401-1406, multiplexer circuits 1411-1414, and D flip-flop circuits 1421-1424.

In the embodiment of FIG. 14, deserializer circuit 202 generates 4 data signals DPRL0-DPRL3 that indicate 4-bit data words. Data signals DPRL3, DPRL2, DPRL1, and DPRL0 are provided to the D inputs of flip-flop circuits 1401, 1402, 1403, and 1404, respectively. The master clock signal MSTCLK is provided to the clock input of each of the flip-flop circuits 1401-1406 and 1421-1424. Flip-flop circuits 1401-1406 and 1421-1424 are single edge flip-flops. Flip-flop circuits 1401-1404 store the values of data signals DPRL3-DPRL0 at their Q outputs in data signals DQ3-DQ0, respectively, in response to each rising edge of clock signal MSTCLK.

Data signals DQ3 and DQ2 are provided to the D inputs of flip-flop circuits 1405 and 1406, respectively. Flip-flop circuits 1405 and 1406 store the values of data signals DQ3 and DQ2 at their Q outputs in data signals DQ5 and DQ4, respectively, in response to each rising edge of clock signal MSTCLK.

Data signals DQ3 and DQ1 are provided to the 0 and 1 multiplexing inputs of multiplexer circuit 1411, respectively. Data signals DQ2 and DQ0 are provided to the 0 and 1 multiplexing inputs of multiplexer circuit 1412, respectively. Data signals DQ1 and DQ5 are provided to the 0 and 1 multiplexing inputs of multiplexer circuit 1413, respectively. Data signals DQ0 and DQ4 are provided to the 0 and 1 multiplexing inputs of multiplexer circuit 1414, respectively. In the embodiment of FIG. 14, the pattern detector circuit generates a single word boundary signal WORDBD that is provided to the select input of each of multiplexer circuits 1411-1414.

Multiplexer circuits 1411-1414 generate data signals Z3, Z2, Z1, and Z0, respectively, at their outputs based on the value of the WORDBD signal and the signals at their multiplexing inputs. Data signals Z3, Z2, Z1, and Z0 are provided to the D inputs of flip-flop circuits 1421, 1422, 1423, and 1424, respectively. Flip-flop circuits 1421-1424 store the values of data signals Z3, Z2, Z1, and Z0 at their Q outputs in signals DPIN3, DPIN2, DPIN1, and DPIN0, respectively, in response to each rising edge of clock signal MSTCLK.

If signal WORDBD equals 0 indicating that the word boundary begins at bit position 0, then multiplexer circuits 1411-1414 provide the values of data signals DQ3, DQ2, DQ1, and DQ0 to signals Z3, Z2, Z1, and Z0, respectively. If signal WORDBD equals 1 indicating that the word boundary begins at bit position 2 in data signal DPRL2, then multiplexer circuits 1411-1414 provide the values of data signals DQ1, DQ0, DQ5, and DQ4 to signals Z3, Z2, Z1, and Z0, respectively. As a result, the bit position of each bit in data signals DPIN0-DPIN3 shifts by 2 bits relative to the equivalent bit in data signals DPRL0-DPRL3 to align the first bit of each 4-bit data word in data signal DPIN0. Thus, if the word boundary begins at bit position 2, barrel shifter circuit 1400 adjusts the positions of the bits in data signals DPIN3, DPIN2, DPIN1, and DPIN0 relative to the positions of the bits in data signals DPRL3, DPRL2, DPRL1, and DPRL0 by 2 bits.

Referring again to FIG. 5, the word boundary signals (or signal) WORDBD are provided to inputs of decision offset circuit 505 if the barrel shifter circuit in word alignment circuit 205 includes selector circuit 1300 or 1400. According to other embodiments, the word boundary signals WORDBD are provided to inputs of decision offset circuit 505 if the barrel shifter circuit in word alignment circuit 205 includes a selector circuit having multiplexer circuits that receive only every fourth parallel data signal, only every fifth parallel data signal, etc.

In embodiments in which the word boundary signals WORDBD are provided to inputs of decision offset circuit 505, the decision offset circuit 505 generates decision offset signals DCOF based on the values of the output signals PHCP of phase evaluator circuit 504 and based on the word boundary signals WORDBD. Decision offset circuit 505 converts the up or down offset value indicated by signals PHCP into a positive integer number V, as described above with respect to FIG. 5. Decision offset circuit 505 then generates a bit shift value based on the positive integer number V, the bit position where each data word in the parallel data signals begins as indicated by the word boundary signals WORDBD, and the granularity of the multiplexer circuits in the barrel shifter circuit.

Decision offset circuit 505 generates a bit shift value that causes the word boundary (i.e., the first bit in each data word) to shift by at least a V number of bits plus any additional bit shifts needed to bring the word boundary to a bit position that is selectable by the multiplexer circuit in the barrel shifter circuit that outputs the first parallel data signal DPIN0. Decision offset circuit 505 uses the word boundary as indicated by signals WORDBD to determine how many additional bit shifts to add to the number V to shift the word boundary to a bit position that is selectable by the multiplexer circuit in the barrel shifter circuit that outputs the first parallel data signal DPIN0. Decision offset circuit 505 then causes the decision offset signals DCOF to indicate the bit shift value, and cycle adjust circuit 506 generates a number of pulses in signal CYCSLP that is based on the bit shift value.

Decision offset circuit 505 receives or stores a value that indicates the granularity of the multiplexer circuits in the barrel shifter circuit. The granularity indicates which bits (i.e., which of the parallel data signals) are selectable by the multiplexers circuits in the barrel shifter circuit. For example, in the embodiment of FIG. 13, decision offset circuit 505 receives or stores a granularity value of 3, indicating that the multiplexer circuits can select every third bit. In the embodiment of FIG. 14, the decision offset circuit 505 receives or stores a granularity value of 2.

As an example, if the word boundary signals WORDBD indicate that the word boundary (i.e., the first bit in each data word) is located at bit position 7 in signal DPRL7, and signals PHCP indicate an up count value of 3/16 for a 16-bit data word (i.e., M=16), then shifting the word boundary by 3 bit positions moves the word boundary to begin in parallel data signal DPRL4. However, if the granularity of the multiplexer circuits in the barrel shifter circuit equals 3 as in selector circuit 1300, then control circuit 204 causes deserializer circuit 202 to shift the bits in the parallel data signals DPRL by 4 bit positions using the CYCSLP signal to cause the word boundary to begin in parallel data signal DPRL3, because multiplexer circuit 1301 can only select from bit positions 0, 3, 6, or 9 in the parallel data signals. The pattern detector circuit 801 or 821 then adjusts the word boundary signals WORDBD to indicate that the word boundary now begins at bit position 3, which causes selector circuit 1300 to shift the word boundary from signal DPRL3 to signal DPIN0 in signals DPIN0-DPIN15.

According to another example, the word boundary signals WORDBD indicate that the word boundary is located at bit position 2 in signal DPRL2, signals PHCP indicate a down count value of −5/16 for a 16-bit data word (i.e., M=16), and the granularity of the multiplexer circuits in the barrel shifter circuit equals 3 as in selector circuit 1300. In this example, control circuit 204 causes deserializer circuit 202 to shift the bits in the parallel data signals DPRL by 12 bit positions (instead of 11 bit positions) using the CYCSLP signal to cause the word boundary to begin in parallel data signal DPRL6, because multiplexer circuit 1301 can only select from bit positions 0, 3, 6, or 9. Pattern detector circuit 801 or 821 then adjusts the word boundary signals WORDBD to indicate that the word boundary now begins at bit position 6, which causes selector circuit 1300 to shift the word boundary from signal DPRL6 to signal DPIN0 in signals DPIN0-DPIN15.

Figure 15:
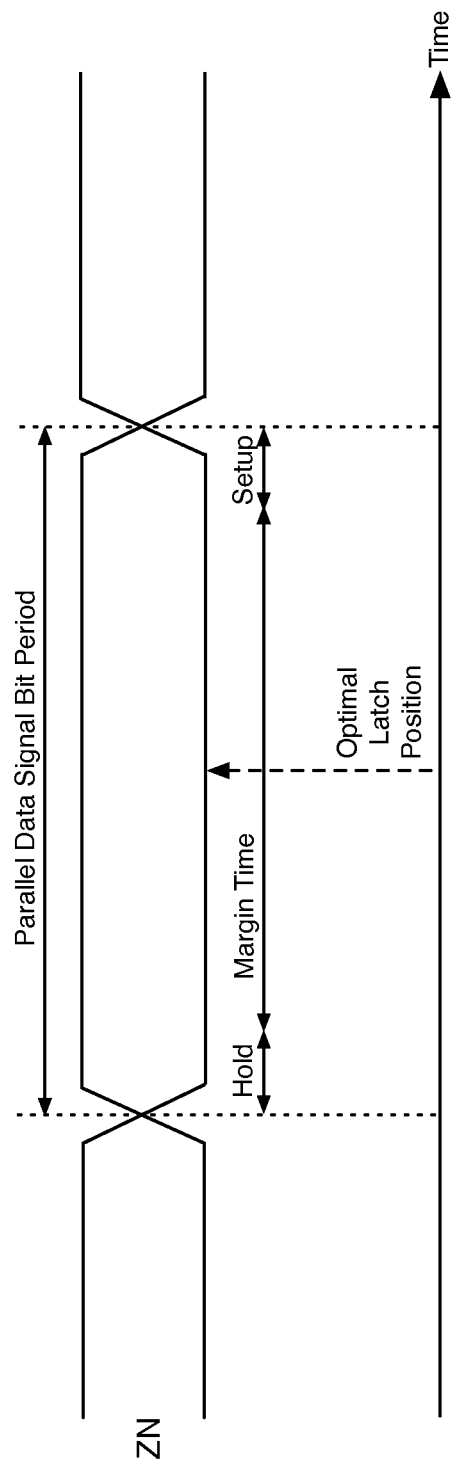
FIG. 15 illustrates an exemplary waveform for a selected data signal ZN, according to an embodiment of the present invention.

FIG. 15 illustrates an exemplary waveform for a selected data signal ZN, according to an embodiment of the present invention. The waveform for signal ZN shown in FIG. 15 is an example of each of the data signals Z0-Z3 shown in FIGS. 10 and 14 and the data signals Z0-Z15 shown in FIGS. 12 and 13. FIG. 15 illustrates an example of a bit period (i.e., a unit interval) of signal ZN. The optimal latch position shown in FIG. 15 is at the middle of the bit period. The optimal latch position corresponds to the ideal time for the corresponding flip-flop circuit (e.g., one of flip-flop circuits 1021-1024, 1221-1236, 1321-1336, and 1421-1424) to store the value of signal ZN. FIG. 15 shows examples of the setup and hold times for the flip-flop circuit. The flip-flop circuit can store the value of signal ZN anytime within the margin time shown in FIG. 15 between the hold and setup times to provide an accurate value of signal ZN to the corresponding data signal DPIN.

The margin time shown in FIG. 15 occurs on both sides of the optimal latch position. The margin time of FIG. 15 equals the time from the end of the hold time until the beginning of the setup time. The threshold used by phase evaluator circuit 504 is based on a predefined phase difference between the RDCLK and MSTCLK clock signals, as described above. The predefined phase difference between the RDCLK and MSTCLK clock signals equals one-half of the margin time shown in FIG. 15. Thus, the threshold used by phase evaluator circuit 504 is based on a maximum of one-half the margin time shown in FIG. 15. Additional margin time may be consumed by dynamic wander or propagation delay variation, reducing the threshold used by the phase evaluator 504. Error detection logic may be incorporated into the protocol logic that can be used to determine when a threshold has been crossed, triggering re-alignment of the parallel signals DPIN.

The duration of the margin time shown in FIG. 15 depends on the bit period of the data signal ZN and the setup and hold times. The deserializer circuit 202, phase detector circuit 203, and control circuit 204 cause each of the 4 clock signals RDCLK generated by receiver circuits 101, 103, 105, and 107 to be aligned with the master clock signal MSTCLK within one-half of the margin time shown in FIG. 15 (i.e., the predefined phase difference). As a result, flip-flop circuits 1021-1024, 1221-1236, 1321-1336, and 1421-1424 store accurate values of the bits in the parallel data signals in response to the master clock signal MSTCLK. The 4 clock signals RDCLK generated by receiver circuits 101, 103, 105, and 107 are aligned with each other within the margin time shown in FIG. 15. Also, the 4 sets of parallel data signals DPINA, DPINB, DPINC, and DPIND generated by receiver circuits 101, 103, 105, and 107, respectively, are aligned and de-skewed with respect to each other. Circuit 200 in each of receiver circuits 101, 103, 105, and 107 reduces the number of register stages used for the data signals to cross clock domains from RDCLK to MSTCLK.

Figure 16:
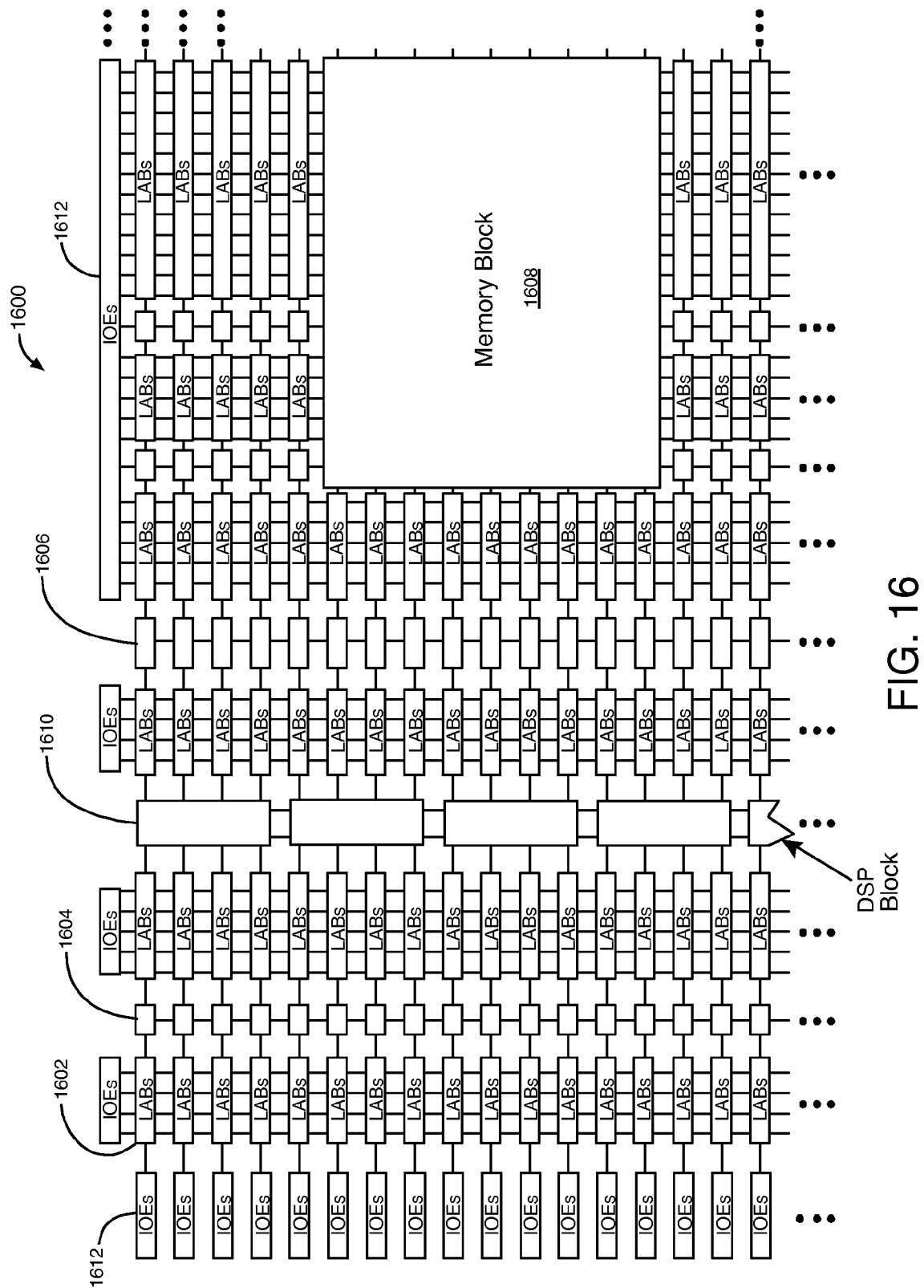
FIG. 16 is a simplified partial block diagram of a field programmable gate array (FPGA) that can include embodiments of the present invention.

FIG. 16 is a simplified partial block diagram of a field programmable gate array (FPGA) 1600 that can include embodiments of the present invention. FPGA 1600 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 1600 includes a two-dimensional array of programmable logic array blocks (or LABs) 1602 that are interconnected by a network of column and row interconnect conductors of varying length and speed. LABs 1602 include multiple (e.g., 10) logic elements (or LEs).

A logic element (LE) is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 1600 also includes a distributed memory structure including random access memory (RAM) blocks of varying sizes provided throughout the array. The RAM blocks include, for example, blocks 1604, blocks 1606, and block 1608. These memory blocks can also include shift registers and first-in-first-out (FIFO) buffers.

FPGA 1600 further includes digital signal processing (DSP) blocks 1610 that can implement, for example, multipliers with add or subtract features. Input/output elements (IOEs) 1612 support numerous single-ended and differential input/output standards. IOEs 1612 include input and output buffers that are coupled to pins of the integrated circuit. The pins are external terminals of the FPGA die that can be used to route, for example, input data signals, output data signals, and supply voltages between the FPGA and one or more external devices. One or more of the IOEs 1612 may include circuits 101-108. FPGA 1600 is described herein for illustrative purposes. Embodiments of the present invention can be implemented in many different types of integrated circuits.

Figure 17:
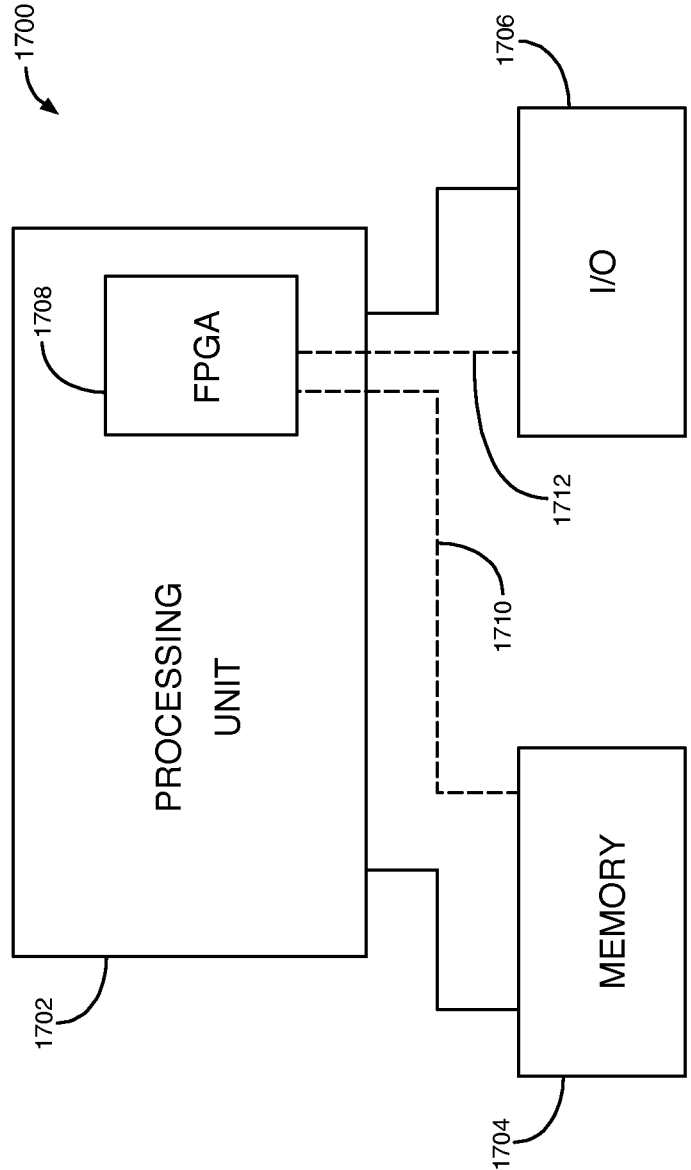
FIG. 17 shows a block diagram of an exemplary digital system that can embody techniques of the present invention.

Embodiments of the present invention can also be implemented in a system that has an FPGA as one of several components. FIG. 17 shows a block diagram of an exemplary digital system 1700 that can embody techniques of the present invention. System 1700 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 1700 can be provided on a single board, on multiple boards, or within multiple enclosures.

System 1700 includes a processing unit 1702, a memory unit 1704, and an input/output (I/O) unit 1706 interconnected together by one or more buses. According to this exemplary embodiment, an FPGA 1708 is embedded in processing unit 1702. FPGA 1708 can serve many different purposes within the system of FIG. 17. FPGA 1708 can, for example, be a logical building block of processing unit 1702, supporting its internal and external operations. FPGA 1708 is programmed to implement the logical functions necessary to carry on its particular role in system operation. FPGA 1708 can be specially coupled to memory 1704 through connection 1710 and to I/O unit 1706 through connection 1712.

Processing unit 1702 can direct data to an appropriate system component for processing or storage, execute a program stored in memory 1704, receive and transmit data via I/O unit 1706, or other similar functions. Processing unit 1702 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 1708 can control the logical operations of the system. As another example, FPGA 1708 acts as a reconfigurable processor that can be reprogrammed as needed to handle a particular computing task. Alternatively, FPGA 1708 can itself include an embedded microprocessor. Memory unit 1704 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A circuit comprising:
   a serial-to-parallel converter circuit to convert a serial data signal into first parallel data signals;
   phase detection circuitry to generate an indication of a phase shift based on a phase offset between a first periodic signal and a second periodic signal; and
   a clock signal generation circuit to provide an adjustment to a phase of the first periodic signal based on the indication of the phase shift, the serial-to-parallel converter circuit to adjust a word boundary of the first parallel data signals by a number of bit positions that is determined by the adjustment to the phase of the first periodic signal.

2. The circuit of claim 1 further comprising:
   a barrel shifter circuit to generate second parallel data signals based on the first parallel data signals, wherein the barrel shifter circuit adjusts positions of bits indicated by the second parallel data signals relative to positions of bits indicated by the first parallel data signals to shift a word boundary in the second parallel data signals.

3. The circuit of claim 2, wherein the barrel shifter circuit comprises storage circuits to store values of the first parallel data signals in response to the second periodic signal.

4. The circuit of claim 2 further comprising:
   a pattern detector circuit to indicate a bit position of a first bit within a data word in the first parallel data signals or in the second parallel data signals, wherein the barrel shifter circuit adjusts the positions of the bits indicated by the second parallel data signals relative to the position of the bits indicated by the first parallel data signals based on the bit position indicated by the pattern detector circuit.

5. The circuit of claim 4, wherein the phase detection circuitry comprises:
   a phase detector circuit to generate an indication of the phase offset between the first periodic signal and the second periodic signal, wherein the barrel shifter circuit comprises a selector circuit to adjust the positions of the bits indicated by the second parallel data signals relative to the positions of the bits indicated by the first parallel data signals; and
   a control circuit to generate the indication of the phase shift based on the indication of the phase offset, based on the bit position indicated by the pattern detector circuit, and based on a minimum bit shift of the selector circuit.

6. The circuit of claim 2, wherein the barrel shifter circuit comprises a selector circuit to adjust the positions of the bits indicated by the second parallel data signals relative to the positions of the bits indicated by the first parallel data signals by a minimum bit shift of at least two bit positions.

7. The circuit of claim 1, wherein the serial-to-parallel converter circuit adjusts the word boundary of the first parallel data signals by a number of bit positions that is determined by a number of adjustments to the phase of the first periodic signal that are provided by the clock signal generation circuit based on the indication of the phase shift.

8. The circuit of claim 1, wherein the serial-to-parallel converter circuit adjusts the word boundary of the first parallel data signals by providing only a subset of bits received in the serial data signal to the first parallel data signals in response to the indication of the phase shift.

9. The circuit of claim 1, wherein the phase detection circuitry generates first and second phase detection signals that are indicative of the phase offset between the first and the second periodic signals, wherein the phase detection circuitry comprises a first counter circuit to generate a first count value based on the first phase detection signal and a second counter circuit to generate a second count value based on the second phase detection signal, wherein the phase detection circuitry generates a signal that provides the indication of the phase shift based on the first and the second count values, and wherein the clock signal generation circuit is a variable frequency divider circuit.

10. The circuit of claim 1, wherein the serial-to-parallel converter circuit adjusts the word boundary of the first parallel data signals by adding at least one duplicate bit to bits received in the serial data signal in response to the indication of the phase shift.

11. A barrel shifter circuit comprising:
    multiplexer circuits, wherein the barrel shifter circuit receives first parallel data signals and generates second parallel data signals based on the first parallel data signals,
    wherein each of the multiplexer circuits is coupled to receive less than all of the bits in each data word that is indicated by the first parallel data signals, and wherein the barrel shifter circuit is only selectable to adjust a word boundary of the second parallel data signals to a first bit position of the second parallel data signals from a subset of bit positions in the first parallel data signals.

12. The barrel shifter circuit of claim 11, wherein the multiplexer circuits adjust positions of bits indicated by the second parallel data signals relative to the bit positions in the first parallel data signals by a maximum number of bit positions that is less than a total number of the first parallel data signals.

13. The barrel shifter circuit of claim 11, wherein the multiplexer circuits adjust positions of bits indicated by the second parallel data signals relative to the bit positions in the first parallel data signals by a minimum bit shift that equals at least two bit positions.

14. The barrel shifter circuit of claim 11, wherein the multiplexer circuits adjust positions of bits indicated by the second parallel data signals relative to the bit positions in the first parallel data signals by a minimum bit shift that equals at least three bit positions.

15. The barrel shifter circuit of claim 11, wherein the barrel shifter circuit is coupled to a pattern detector circuit to indicate a bit position of a first bit within a data word in the first parallel data signals or in the second parallel data signals, and wherein the barrel shifter circuit adjusts positions of bits indicated by the second parallel data signals relative to the bit positions in the first parallel data signals based on the bit position indicated by the pattern detector circuit.

16. The barrel shifter circuit of claim 15, wherein the barrel shifter circuit is part of a receiver circuit that comprises:
    a serial-to-parallel converter circuit to convert a serial data signal into the first parallel data signals;
    a phase detector circuit to generate an indication of a phase offset between first and second periodic signals;

a control circuit to generate an indication of a phase shift based on the indication of the phase offset; and a clock signal generation circuit to provide an adjustment to a phase of the first periodic signal based on the indication of the phase shift, wherein the serial-to-parallel converter circuit adjusts a word boundary of the first parallel data signals by a number of bit positions that is determined by the adjustment to the phase of the first periodic signal.

17. The barrel shifter circuit of claim 16, wherein the control circuit generates the indication of the phase shift based on the indication of the phase offset and based on the bit position indicated by the pattern detector circuit.

18. A method comprising:

converting a serial data signal into first parallel data signals using a serial-to-parallel converter circuit;

generating an indication of a phase shift based on a phase offset between a first periodic signal and a second periodic signal using phase detection circuitry;

providing an adjustment to a phase of the first periodic signal based on the indication of the phase shift; and adjusting a word boundary of the first parallel data signals by a number of bit positions that is determined by the adjustment to the phase of the first periodic signal using the serial-to-parallel converter circuit.

19. The method of claim 18 further comprising:

generating second parallel data signals based on the first parallel data signals using a barrel shifter circuit;

indicating a bit position of a first bit within a data word in the first parallel data signals or in the second parallel data signals using a pattern detector circuit; and adjusting positions of bits indicated by the second parallel data signals relative to positions of bits indicated by the first parallel data signals to shift a word boundary in the second parallel data signals using the barrel shifter circuit based on the bit position of the first bit within a data word as indicated by the pattern detector circuit.

20. The method of claim 19, wherein a minimum bit shift that the barrel shifter circuit adjusts the positions of the bits indicated by the second parallel data signals relative to the positions of the bits indicated by the first parallel data signals is at least two bit positions.

21. The method of claim 19, wherein generating an indication of a phase shift based on a phase offset between a first periodic signal and a second periodic signal using phase detection circuitry further comprises:

generating an indication of the phase offset between the first periodic signal and the second periodic signal using a phase detector; and generating the indication of the phase shift based on the indication of the phase offset, based on the bit position of the first bit within a data word as indicated by the pattern detector circuit, and based on a minimum bit shift that the barrel shifter circuit adjusts the positions of the bits indicated by the second parallel data signals relative to the positions of the bits indicated by the first parallel data signals.

22. The method of claim 18, further comprising:

storing values of the first parallel data signals in storage circuits in response to the second periodic signal.

23. The method of claim 18 wherein, adjusting a word boundary of the first parallel data signals by a number of bit positions that is determined by the adjustment to the phase of the first periodic signal using the serial-to-parallel converter circuit comprises adjusting the word boundary of the first parallel data signals by a number of bit positions that is determined by a number of adjustments to the phase of the first periodic signal that are provided based on the indication of the phase shift.

24. A method comprising:

receiving first parallel data signals at a barrel shifter circuit that comprises multiplexer circuits;

generating second parallel data signals based on the first parallel data signals using the barrel shifter circuit;

providing only a subset of the bits in each data word indicated by the first parallel data signals to inputs of each of the multiplexer circuits; and adjusting a word boundary of the second parallel data signals using the barrel shifter circuit, wherein the barrel shifter circuit is only selectable to adjust the word boundary of the second parallel data signals to a first bit position of the second parallel data signals from a subset of bit positions in the first parallel data signals.

25. The method of claim 24, wherein the multiplexer circuits adjust positions of bits indicated by the second parallel data signals relative to the bit positions in the first parallel data signals by a maximum number of bit positions that is less than a total number of the first parallel data signals.

26. The method of claim 24, wherein a minimum bit shift that the multiplexer circuits adjust positions of bits indicated by the second parallel data signals relative to the bit positions in the first parallel data signals is at least two bit positions.

27. The method of claim 24, wherein a minimum bit shift that the multiplexer circuits adjust positions of bits indicated by the second parallel data signals relative to the bit positions in the first parallel data signals is at least three bit positions.

\* \* \* \* \*